United States Patent
Watanabe et al.

[11] Patent Number: 6,080,990
[45] Date of Patent: *Jun. 27, 2000

[54] POSITION MEASURING APPARATUS

[75] Inventors: Shinya Watanabe; Hitoshi Suzuki; Kazuo Abe; Susumu Saito, all of Tokyo; Toru Tojo, Ninomiya-machi; Ryoichi Hirano, Yokohama, all of Japan

[73] Assignees: Kabushiki Kaisha Topcon, Tokyo; Kabushiki Kaisha Toshiba, Kawasaki, both of Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/040,391

[22] Filed: Mar. 18, 1998

[30] Foreign Application Priority Data

Mar. 21, 1997 [JP] Japan ................................. 9-068669

[51] Int. Cl.$^7$ ................................................ G01B 11/14
[52] U.S. Cl. ............................... 250/491.1; 250/559.31; 356/375
[58] Field of Search ........................... 250/491.1, 559.27, 250/559.38, 559.31; 356/375, 373, 376

[56] References Cited

U.S. PATENT DOCUMENTS 5,530,550   6/1996   Nikoonahad et al. ............ 250/559.31

FOREIGN PATENT DOCUMENTS 10-026513   1/1998   Japan .
9-66702     9/1998   Japan .

*Primary Examiner*—Kiet T. Nguyen
*Attorney, Agent, or Firm*—Jacobson, Price, Holman & Stern PLLC

[57] ABSTRACT

A position measuring apparatus includes a light source 1, an illumination optical system 100, a light-reception optical system 400 and a light-receiving unit 500. Illuminating beam emitted from the light source 1 is diffracted by a two-dimensional pattern on an object 10, and then enters the light-reception optical system 400. The light-receiving unit 500 receives diffracted lights consisting of a combination of a higher-order diffracted light appearing on the object side for the zero-order diffracted light in the receive diffracted lights with a zero-order diffracted light different in frequency from the higher-order diffracted light and another combination of higher-order diffracted lights different in frequency from one another and appearing on the object side for the zero-order diffracted light, thereby forming a position measuring interference measurement signal within the plane including the object. A signal processing unit is adapted to measure the position of the object 10 based on the phase of the position measuring interference measurement signal.

10 Claims, 19 Drawing Sheets

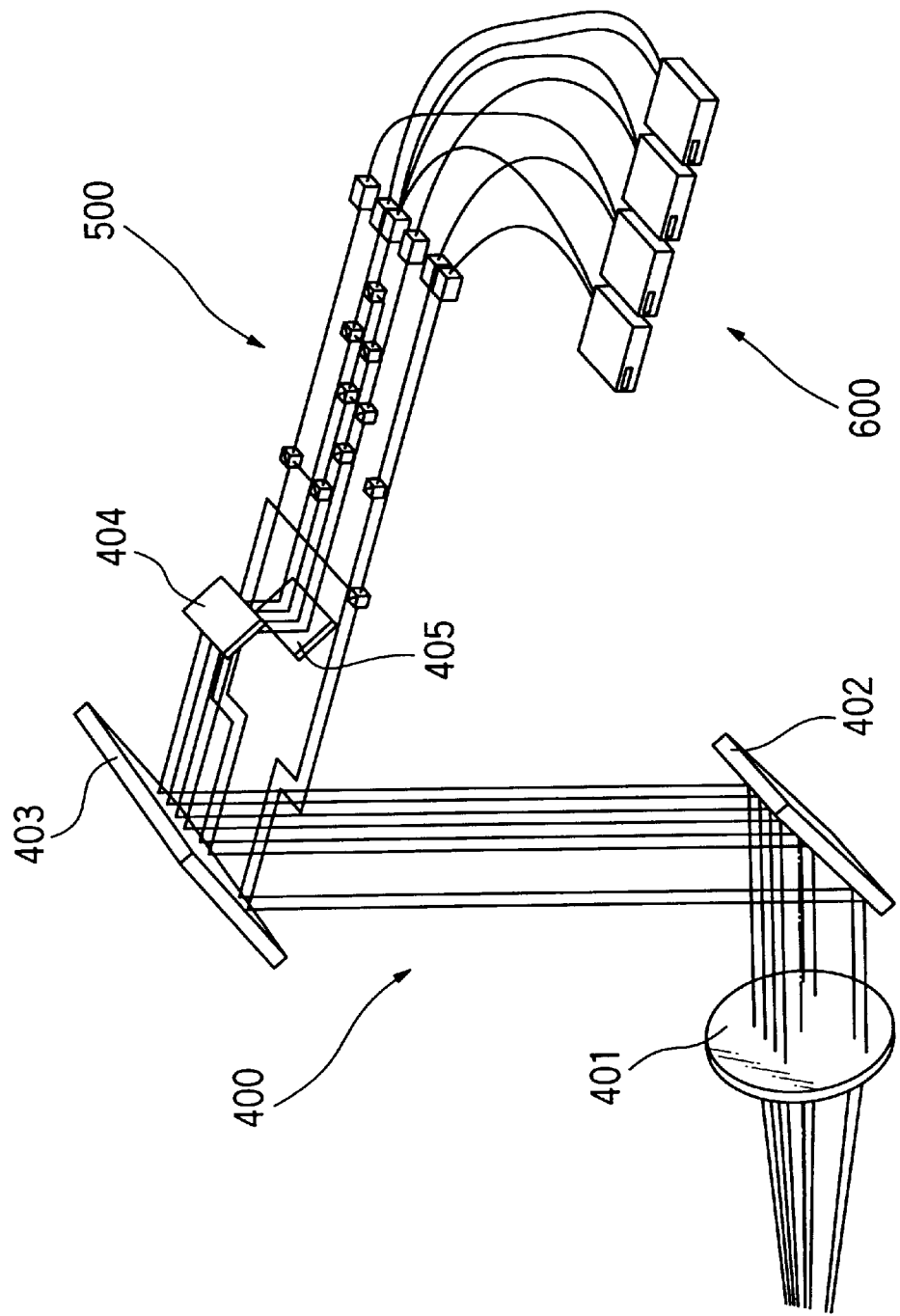

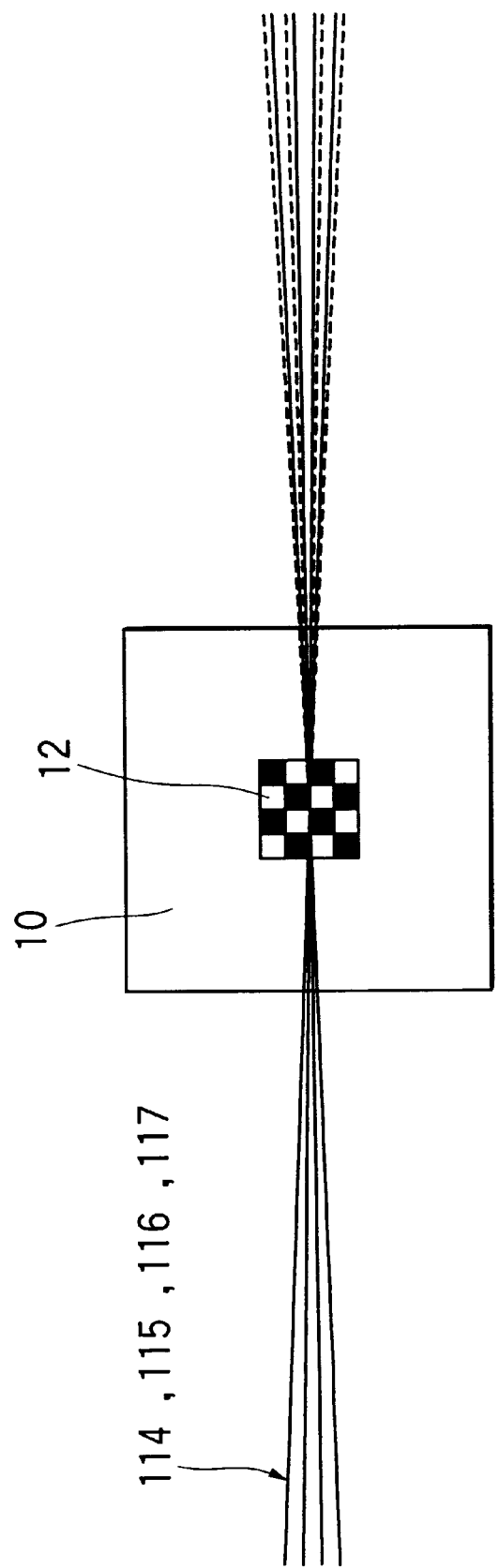

POSITION MEASURING APPARATUS

BACKGROUND OF THE INVENTION

The present invention relates to a position measuring apparatus which can be utilized in a working machine for working the surface of an object, a measuring machine for measuring the surface state of an object or the like for a purpose of controlling the position of the object or other purposes.

The present invention also relates to an electron beam lithography system to which the position measuring apparatus is applied.

In the semiconductor aligner of the prior art, a desired circuit pattern on a pre-formed original pattern (reticle or mask) is transferred onto a wafer after the circuit pattern has been aligned with an exposure area on the wafer. Such a transferring device is a high-precision reduction projection aligner and fixed to a high-precision X-Y stage on the side of wafer for exposing the entire wafer surface to be transferred. The transferring device is called "stepper" when it is used to perform the step/repeat action relative to the optical wafer system.

As the integration of LSI recently increases, the circuit line width required by the semiconductor is more and more reducing. The rate of reduction in the prior art stepper is mainly 1/5. It has been said that patterns equal to or less than one $\mu$m could not be resolved due to the past limits of wavelength. However, patterns in order of sub $\mu$m can be resolved by the use of an improved optical or illumination system, a phase shift mask for regulating the phase of the light on the reticle or the like. With improvement of the resolution, the focal depth of the reducing glass has been smaller. Further, the precision required by the transfer of the pre-formed original pattern onto the wafer has been more strict. It is thus required that the positions of a specimen relative to the alignment optical system of the stepper in the directions of specimen surface and focus are detected with higher precision.

The phase shift mask is adapted to reduce the phase of a light passing through the light transmission portion of the original pattern or the optical distance of the light transmission portion by etching the thickness of a substrate or otherwise to change the optical distance through a technique of adding a material of different refractive index or any other technique. Therefore, the phase shift mask is prepared by a method of selectively cutting the substrate at a particularly light transmission part in the direction of thickness to change the optical distance or a method of again applying a resist onto the substrate on which the pattern has already been drawn and adding a material for partially changing the phase of the light transmission part before any unnecessary part is etched out. In any event, the pattern drawing device must be used to expose the resist at a given location with high precision.

Prior to detection of an alignment mark on the mask, the position of an exposing beam is measured and calibrated by the use of a mark on the stage or the like. Since the position of the stage is precisely monitored by the laser interferometer, the position and displacement of the beam can be measured based on the coordinate system in the laser interferometer.

If the interior of the body tube in an electron beam aligner is contaminated, however, a drift may be created in the electron beam due to charge-up. This may vary measurements. Since the position of the mark on the mask is measured indirectly through the mark on the stage, it cannot be judged whether the variations in the measurements is caused by the beam drift or by the displacement of the mark itself.

In the electron beam lithography system and stepper, it may be considered that a measurement optical system using a laser beam is used as means for precisely measuring the position of a mark without affection of any drift. However, the internal space of the electron beam lithography system or stepper is substantially occupied by its inherent drawing optical system. It is often found that an internal space required to arrange the optical system for measuring the position of an object to be worked is limited.

Particularly in a system of such a type that a laser beam is irradiated onto a given diffraction pattern to form a diffracted light which is in turn used to obtain the information relating to the position of the object, the diffracted light required to measure the position of the object intends to be blocked by a member or members required to work the object in the drawing optical system, projection optical system or the like, since the diffracted light at the diffraction pattern is spread out.

There is a further need of providing an electron beam lithography system to which a small-size and high-precision position measuring apparatus is applied.

It is therefore an object of the present invention to provide a position measuring apparatus which can use a diffracted light obtained through less space to measure the position of an object.

Another object of the present invention is to provide an apparatus which can precisely measure the position of an object and particularly its position in X and Y directions.

A further object of the present invention is to provide a small-size and high-precision electron beam lithography system comprising a position measuring apparatus which can precisely measure the position of an object.

SUMMARY OF THE INVENTION

The present invention provides a position measuring apparatus comprising a light source unit for emitting a coherent light to provide an illuminating beam, a frequency shifter unit for converting the beam from said light source unit into a beam having its frequency different from that of said illuminating beam and for radiating the converted beam, an illumination optical system for converting the illuminating beam from the light source unit into a first plane position measurement illuminating beam and the beam from the frequency shifter unit into a second plane position measurement illuminating beam, said illumination beam being used to irradiate a two-dimensional pattern on an object to be measured with respect to its position, a light-reception optical system for receiving a diffracted light from the two-dimensional pattern, a light receiving unit for receiving a combination of a higher-order diffracted light appearing on the object side from the zero-order diffracted light in the diffracted light received by the light-reception optical system with the zero-order diffracted light different in frequency from the higher-order diffracted light and also an interference light from a combination of higher-order diffracted lights appearing on the object side from the zero-order diffracted light, said higher-order diffracted light being different in frequency from one another, said light receiving unit being adapted to form a position measuring interference measurement signal used to perform the positional measurement in the plane of the object including the two-dimensional pattern, and a signal processing unit for determining the position of the object in the plane including the two-dimensional pattern in response of the phase of the position measuring interference measurement signal.

In such an arrangement, the two-dimensional pattern on the object can be irradiated by the illuminating beam from the light source unit to form a diffracted light which can be received in less space. This can provide a small-size and high-precision position measuring apparatus.

In the position measuring apparatus of the present invention, it is preferred that the light-receiving unit is adapted to form an X position measuring interference measurement signal representative of the X-direction position of the object in the plane including the two-dimensional pattern from a combination of the higher-order diffracted light from the first plane position measurement illuminating beam with the higher-order diffracted light from the second plane position measurement illuminating beam and also to form a Y position measuring interference measurement signal from a combination of the zero-order diffracted light from the first plane position measurement illuminating beam with the higher-order diffracted light from the second plane position measurement illuminating beam or a combination of the higher-order diffracted light from the first plane position measurement illuminating beam with the zero-order diffracted light from the second plane position measurement illuminating beam. It is also preferred that the signal processing unit is adapted to determine the X-direction position of the object from the phase of the X position measuring interference measurement signal and to determine the Y-direction position of the object from the phase of the Y position measuring interference measurement signal.

In such an arrangement, the X and Y direction positions of the object in the plane including the two-dimensional pattern can precisely be determined.

In the position measuring apparatus of the present invention, it is further preferred that the light-receiving unit is further adapted to form an X position measuring interference reference signal from a combination of zero-order diffracted lights of the first and second plane position measurement illuminating beams due to the two-dimensional pattern, said zero-order diffracted light being different in frequency from each other, and also to form a Y position measuring interference reference signal from a combination of the higher-order diffracted light of the first plane position measurement illuminating beam with the zero-order diffracted light of the second plane position measurement illuminating beam or a combination of the zero-order diffracted light of the first plane position measurement illuminating beam with the higher-order diffracted light of the second plane position measurement illuminating beam, and that the signal processing unit is adapted to determine the X-direction position of the object from the differential phase between the X position measuring interference measurement signal and the X position measuring interference reference signal and also to determine the Y direction position of the object from the differential phase between the Y position measuring interference measurement signal and the Y position measuring interference reference signal.

In such an arrangement, the signal can more effectively be processed to determine the precise X and Y direction positions of the object in the plane including the two-dimensional pattern.

In the position measuring apparatus of the present invention, it is further preferred that the light-receiving unit is so formed that the X position measuring interference measurement and reference signals equally contain information of mis-registration in the Y direction and that the Y position measuring interference measurement and reference signals equally contain information of mis-registration in the X-direction.

It is further preferred that the signal processing unit is adapted to determine the phase and phase difference from signals formed by heterodyne detecting and processing the respective interference measurement signals.

In these arrangements, the signal can more effectively be processed to determine the precise X and Y direction positions of the object in the plane including the two-dimensional pattern.

The present invention further provides an electron beam lithography system comprising such a position measuring apparatus as aforementioned, said position measuring apparatus being disposed to avoid the mounts of the components in said electron beam lithography system and their maximum range of operation, said position measuring apparatus comprising an illumination side optical member for irradiating a position measuring beam used to measure the position of an object and a light-reception side optical member for receiving a reflected and diffracted light from the object to measure the position of the object, said optical members being so disposed that the beam entering the light-reception side optical member from the illumination side optical member can pass through the electron beam lithography system while avoiding the mounts of the components in said electron beam lithography system and their maximum range of operation.

In such an arrangement, the position of the object to be worked can precisely be measured. Thus, the object can be worked by the electron beam lithography system with an extremely high precision.

BRIEF DESCRIPTION OF THE DRAWINGS

FIG. 18 is a fragmentary view, in an enlarged scale, of the light-reception optical system shown in FIG. 1.

FIG. 19 is a fragmentary view, in an enlarged scale, of the object portion shown in FIG. 11.

DETAILED DESCRIPTION OF THE PREFERRED EMBODIMENT

Figure 1:
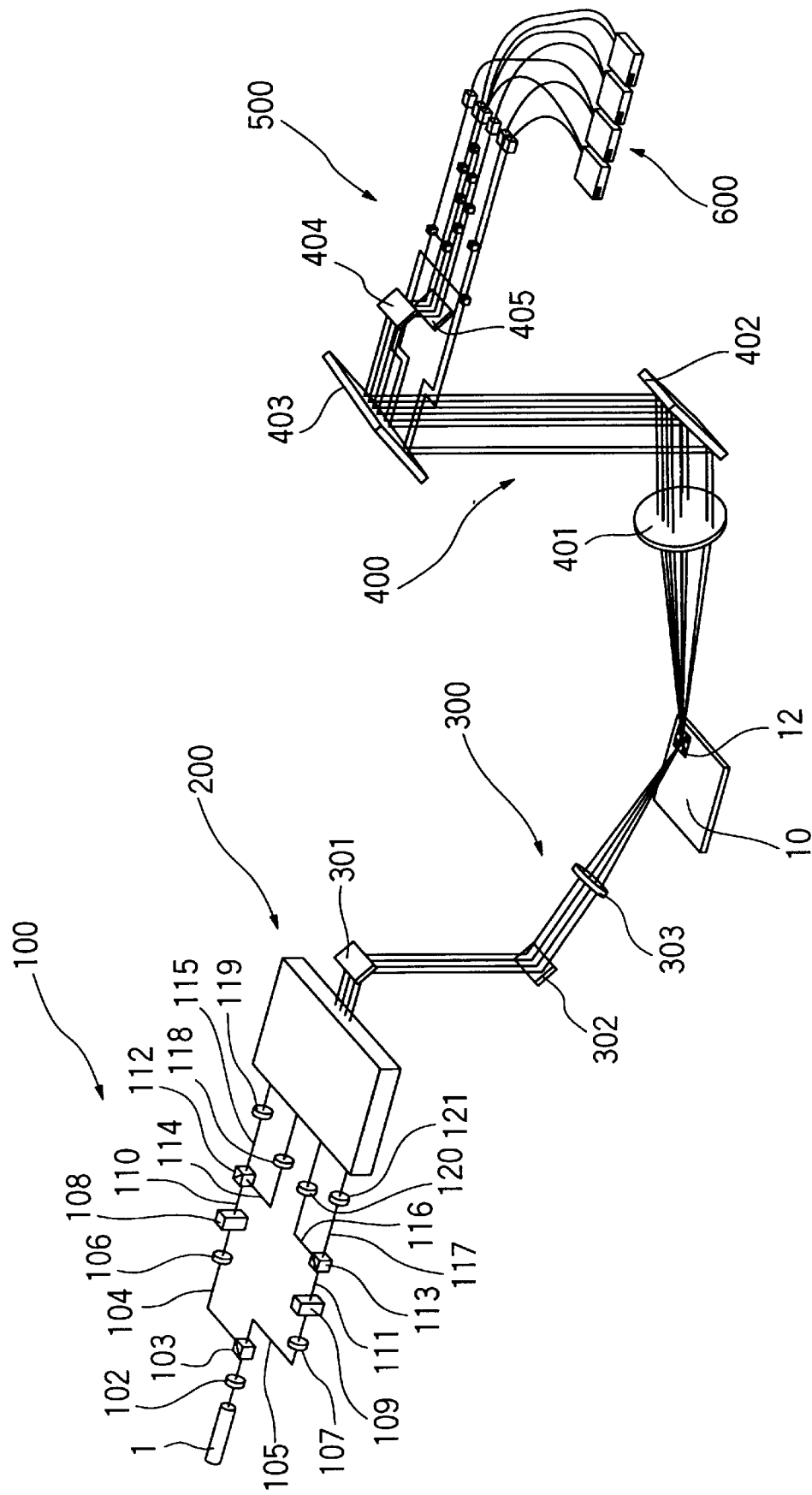
FIG. 1 is a schematic view of an optical system in one embodiment of a position measuring apparatus constructed in accordance with the present invention.

Referring first to FIG. 1, there is shown a position measuring apparatus according to the present invention which comprises an illumination optical system 100, a compensation optical system 200, an irradiation optical system 300 and a light-reception optical system 400.

1 Illumination Optical System 100

Referring to FIG. 1 and FIGS. 16 to 18 which are enlarged views of FIG. 1, a light source 1 is adapted to emit a coherent light providing an illuminating beam. The light source 1 may be He-Ne laser light source having a wavelength $\lambda = 633$ nm. The laser beam, which is a highly coherent light from the light source 1, is divided into first and second illuminating beams 104, 105 by a beam splitter 103 through a relay lens 102.

The first illuminating beam 104 is conducted to a first frequency shifter 108 through a relay lens 106. The first frequency shifter 108 modulates the first illuminating beam 104 to form a first measurement illuminating beam 110. The second illuminating beam 105 is conducted to a second frequency shifter 109 through a relay lens 107. The second frequency shifter 109 modulates the second illuminating beam 105 to form a second measurement illuminating beam 111.

The frequency shifters are preferably in the form of an acoustooptical element (AOM). The frequency of the first measurement illuminating beam 110 modulated by the frequency shifter is 80.05 MHz while the frequency of the second measurement illuminating beam 111 modulated by the frequency shifter is 80.0625 MHz. Thus, the frequency shifters 108 and 109 will form the first and second measurement illuminating beams 110, 111 which are slightly different in frequency from each other. The differential frequency $\Delta f$ between the first and second measurement illuminating beams 110, 111 is equal to 12.5 KHz. When the first and second measurement illuminating beams 110, 111 are superimposed over each other to create an interference, the strength of such an interference produces a beat signal having its frequency of $\Delta f$.

A beam splitter 112 divides the first measurement illuminating beam 110 into a first plane position measurement illuminating beam 114 and a first normal-direction measurement illuminating beam 115.

A beam splitter 113 divides the second measurement illuminating beam 111 into a second plane position measurement illuminating beam 116 and a second normal-direction measurement illuminating beam 117.

The first plane position measurement illuminating beam 114, first normal-direction measurement illuminating beam 115, second plane position measurement illuminating beam 116 and normal-direction measurement illuminating beam 117 are respectively conducted to the adjusting optical system 200 through relay lenses 118, 119, 120 and 121 as beams parallel to the optical axis of the adjusting optical system 200.

However, the first and second normal-direction measurement illuminating beams 115, 117 may be divided from the respective measurement illuminating beams that are separate from the first and second plane position measurement illuminating beams 114, 116.

In the illumination optical system 100, the light source 1 becomes conjugate with the first and second frequency shifters 108, 109 through the relay lenses 102, 106 and 107.

2 Adjusting Optical System 200

Figure 2:
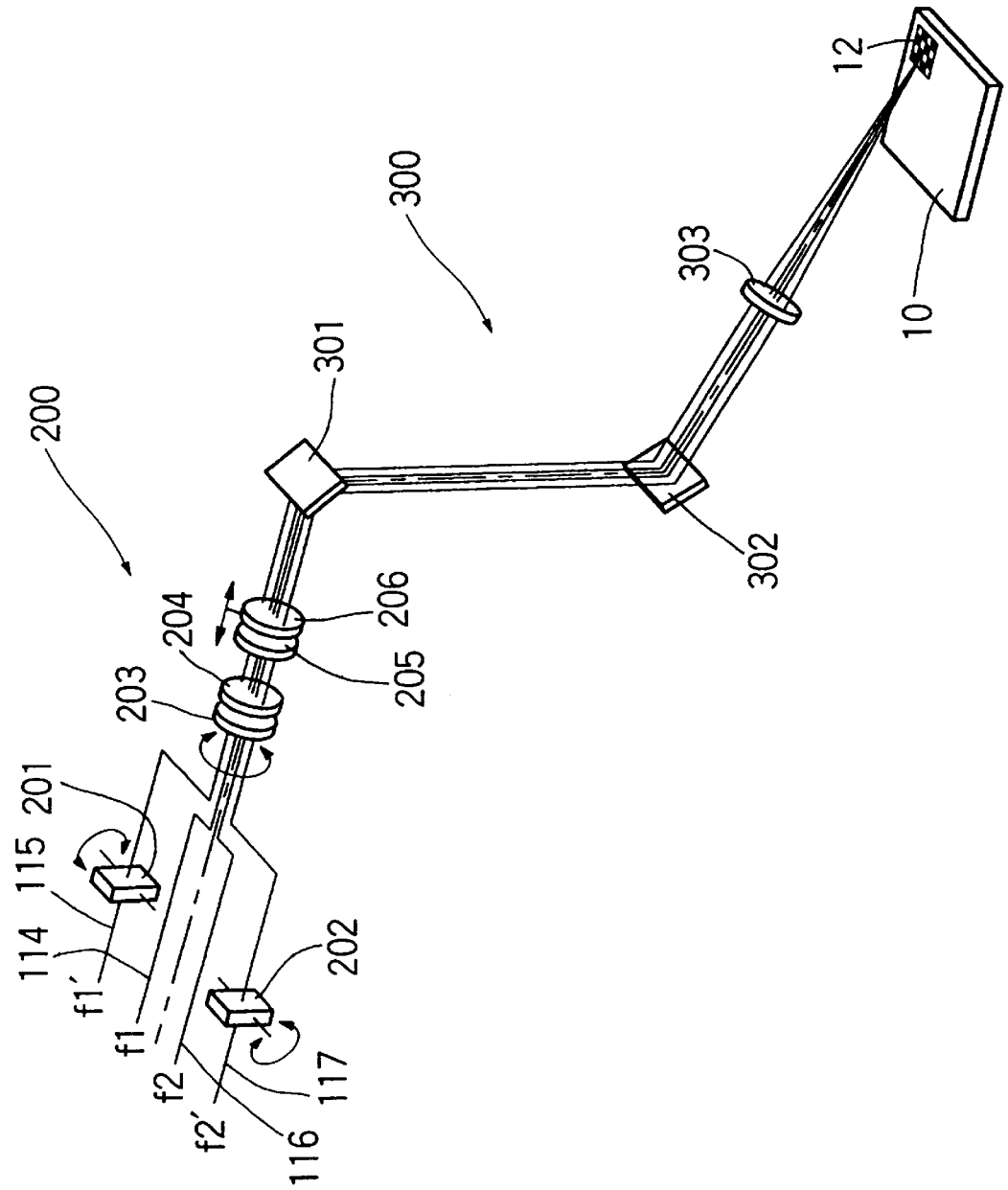
FIG. 2 is a perspective view of adjusting and illuminating optical systems in the position measuring apparatus of the present invention.
Figure 3:
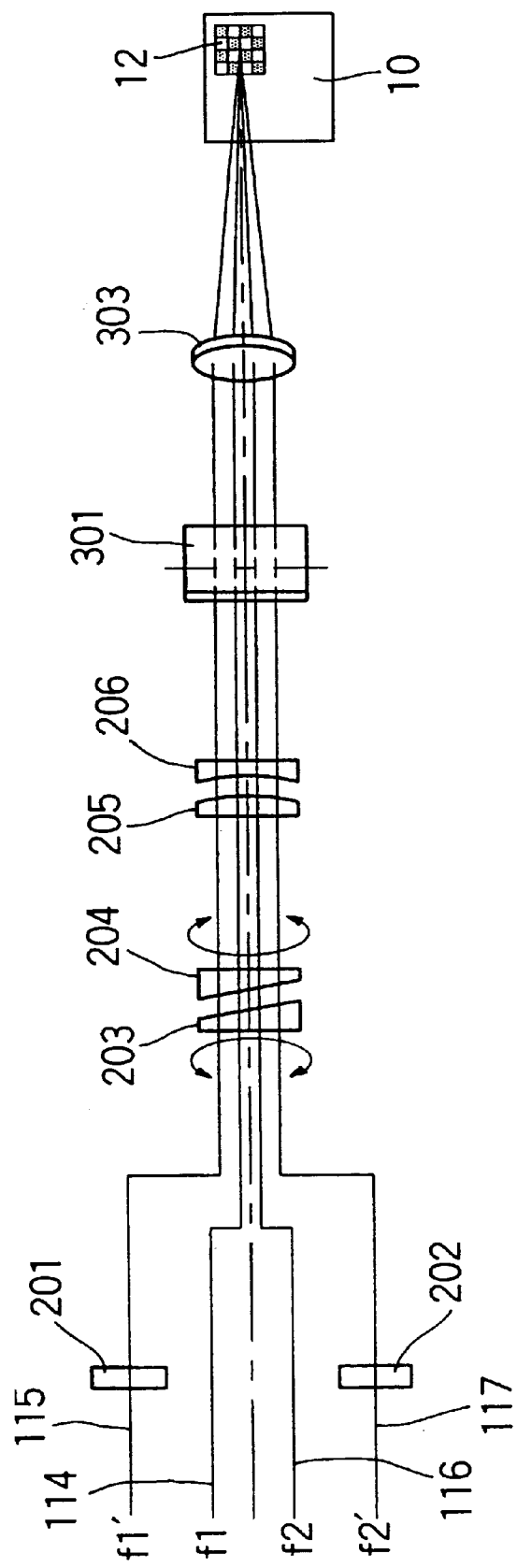
FIG. 3 is a plan view of the adjusting and illuminating optical systems in the position measuring apparatus of the present invention.
Figure 4:
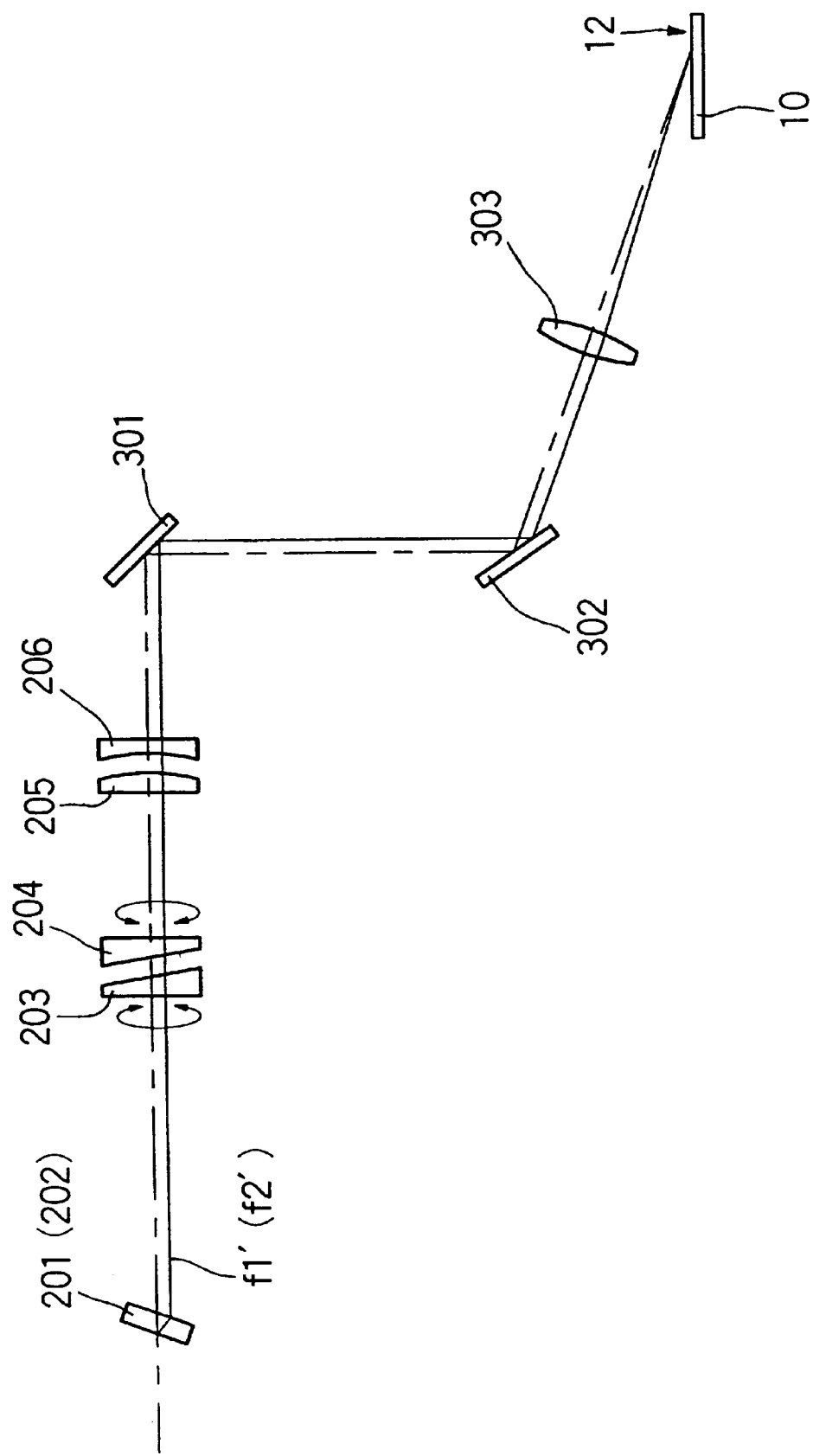
FIG. 4 is a side view of the adjusting and illuminating optical systems in the position measuring apparatus of the present invention.

As shown in FIGS. 2 to 4, the adjusting optical system 200 is an optical system for compensating the first plane position measurement illuminating beam 114, first normal-direction measurement illuminating beam 115, second plane position measurement illuminating beam 116 and normal-direction measurement illuminating beam 117 so that they will meet a given illumination condition. Such a compensation includes three types, an irradiation angle adjustment for adjusting the irradiation angle (incident angle) of the first and second normal-direction measurement illuminating beams 115, 117 relative to the first and second plane position measurement illuminating beams 114, 116, a plane position adjustment for adjusting the plane position on the object irradiated by the four illuminating beams 114–117 and a beam waist position adjustment for adjusting the beam waist position of these four illuminating beams 114–117 to be placed on the object 10.

The irradiation angle adjustment for the first and second normal-direction measurement illuminating beams 115, 117 is carried out by rotating each parallel plane plate 201 or 202 inserted into the optical axis of the corresponding illuminating beam about a rotational axis perpendicular to the optical axis. The first and second normal-direction measurement illuminating beams 115, 117 are translated in the vertical direction by rotation of the parallel plane plates 201 and 202, resulting in change of the irradiation angle (incident angle) through a projection lens which will be described later. The term "vertical direction" used herein means a direction perpendicular to a plane including all the four illuminating beams 114–117.

The four measurement illuminating beams 114–117 are reduced in spacing through two mirrors (not shown) in the respective optical axes and then enter a set of wedge prisms 203 and 204 which are equal in vertical angle to each other.

The plane position adjustment for the four measurement illuminating beams 114–117 is carried out by adjusting the intersection angle and center between the wedge prisms 203 and 204 about a central axis for horizontal adjustment.

The distance between the pre-adjusted position of each of the measurement illuminating beams 114–117 and the post-adjusted position of the same is determined by adjusting the angle of intersection between the wedge prisms 203 and 204. The direction of change from the pre-adjusted direction is determined by adjusting the center of intersection between the wedge prisms 203 and 204. By performing these adjustments, the plane positions of the four measurement illuminating beams 114–117 can be adjusted in any of all the directions.

The four measurement illuminating beams 114–117 enter focus lenses 205 and 206 after they have been adjusted by the wedge prisms 203 and 204 with respect to their plane positions.

The distance between the focus lenses 205 and 206 may be changed to vary the spacing between each beam and the optical axis while maintaining the beam parallel to the optical axis. Thus, the positions of the beam waists in the four measurement illuminating beams 114–117 may be adjusted in the direction of optical axis so that the beam waists of the four measurement illuminating beams 114–117 will be placed on the object 10.

In the illustrated embodiment of the present invention, the source side adjusting lens 205 is a plane convex lens while the object side adjusting lens 206 is a plane-concave lens.

As the spacing between the focus lenses 205 and 206 is increased, the positions of the beam waists will be changed to approach the light source.

However, the focus lens 205 on the side of the light source 1 may be a plane concave lens while the focus lens 206 on the side of the object 10 may be a plane convex lens.

When in such a manner, the first and second plane position measurement illuminating beams 114, 116 are disposed adjacent to the optical axis and the first and second normal-direction measurement illuminating beams 115, 117 used to adjust the irradiation angle are respectively disposed outside the first and second plane position measurement illuminating beams 114, 116, the parallel plane plates 201 and 202, which are optical elements for adjusting the irradiation angle, may be disposed in the optical paths of the respective normal-direction measurement illuminating beams. In addition, a mechanism for rotating each of the parallel plane plates 201 and 202 about the rotational axis perpendicular to the corresponding optical axis can be facilitated to be installed in the system.

2-1 Manual Adjustment

The adjusting optical system 200 will further be described in connection with beam adjustment. The following description will preferentially be based on the position.

In the initial state, the wedge prisms 203 and 204 are oriented yin the inverse position by rotating them through 180 degrees. Apparently, these prisms are in power-off state. It is further assumed that the adjusting lenses 205 and 206 are disposed with approximately zero spacing therebetween, resulting in power-off state.

In this adjustment in which the position antecedes the other things, the wedge prisms 203 and 204 are used to move the initial position of beam irradiation onto a mark 12 to be primarily irradiated. The adjusting lenses 205 and 206 are then used to adjust the beam waist positions so that the beam waists of the four measurement illuminating beams 114–117 will be placed on the object 10.

More particularly, the direction of movement of the beams is coincide with the direction of a bisector for the angle of intersection between the wedge prisms 203 and 204. Therefore, both the prisms 203 and 204 may be rotated based on the initial position of beam irradiation such that the direction of the mark 12 to be irradiated by the beams is coincide with the direction of the bisector for the angle of intersection between the wedge prisms 203 and 204.

Since the distance of beam movement increases as the intersection angle between the wedge prisms 203 and 204 approaches zero degrees from 180 degrees, the intersection angle between the wedge prisms 203 and 204 can be adjusted to irradiate the two-dimensional pattern 12 on the object 12 while maintaining the direction of the bisector for the intersection angle between the wedge prisms 203 and 204.

After the beam positions of the four measurement illuminating beams 114–117 have been adjusted to be placed on the two-dimensional pattern 12 of the object 10, the spacing between the adjusting lenses 205 and 206 is adjusted in consideration of various factors such as the maximum strength of an interference signal or the like such that the beam waists will be placed on the two-dimensional pattern 12 of the object 10.

Since in this embodiment, the adjusting lens 205 on the side of the light source 1 is a plane-convex lens and the adjusting lens 206 on the side of the object 10 is a plane-concave lens, the beam waists may approach the light source as the distance between the adjusting lenses 205, 206 increases.

3 Illumination Optical System 300

As shown in FIGS. 2 to 4, the illumination optical system 300 comprises return mirrors 301, 302 and an irradiating lens 303. The illumination optical system 300 is designed to focus the four beams, first and second plane position measurement illuminating beams 114, 116 and first and second normal-direction measurement illuminating beams 115, 117 onto a spot on the two-dimensional pattern 12 of the object 10.

Since at this time, the compensation optical system 200 performs a given compensation, the illumination optical system 300 emits the first and second plane position measurement illuminating beams 114, 117 together with an incident angle $\theta 1$ relative to a normal for the plane including the object 10, the first normal-direction measurement illuminating beam 115 with an incident angle $\theta 2$ different from the incident angle $\theta 1$, and the second normal-direction measurement illuminating beam 117 with an incident angle $\theta 3$ different from the incident angles $\theta 1$ and $\theta 2$.

The illumination optical system 300 including the irradiating lens 303 is designed to locate the beam waist at the farthest position within the range of beam waist adjustment under such a condition that the adjusting lenses 205 and 206 for adjusting the beam waist positions do not function or that the adjusting lenses 205 and 206 are in contact with each other.

By suitably selecting the spacing between the adjusting lenses 205 and 206 for adjusting the beam waist positions, the adjustment can be performed such that the beam waists of the measurement illuminating beams will be placed on the object 10. On completion of these various adjustments, all of the light source 1, frequency shifters 108, 109 and object 10 form a conjugate relationship.

The two-dimensional diffraction pattern 12 on the object 10 is formed by a checked grid. The checked grid has pitches d which are equal in the X and Y directions.

Four measurement illuminating beams entering the checked grid on the object 10 are reflected and diffracted by the checked grid.

When only the first plane position measurement illuminating beam 114 is to be noted, the relationship among the incident angle θ, the angle of diffraction θx of the one-order diffracted light in the X-direction and the angle of diffraction θy of the same in the Y direction is given by the following formulas:

$$\sin \theta x = \pm \lambda/d \quad (1)$$

$$\sin \theta y = \sin \theta \pm \lambda/d \quad (2).$$

Figure 5:
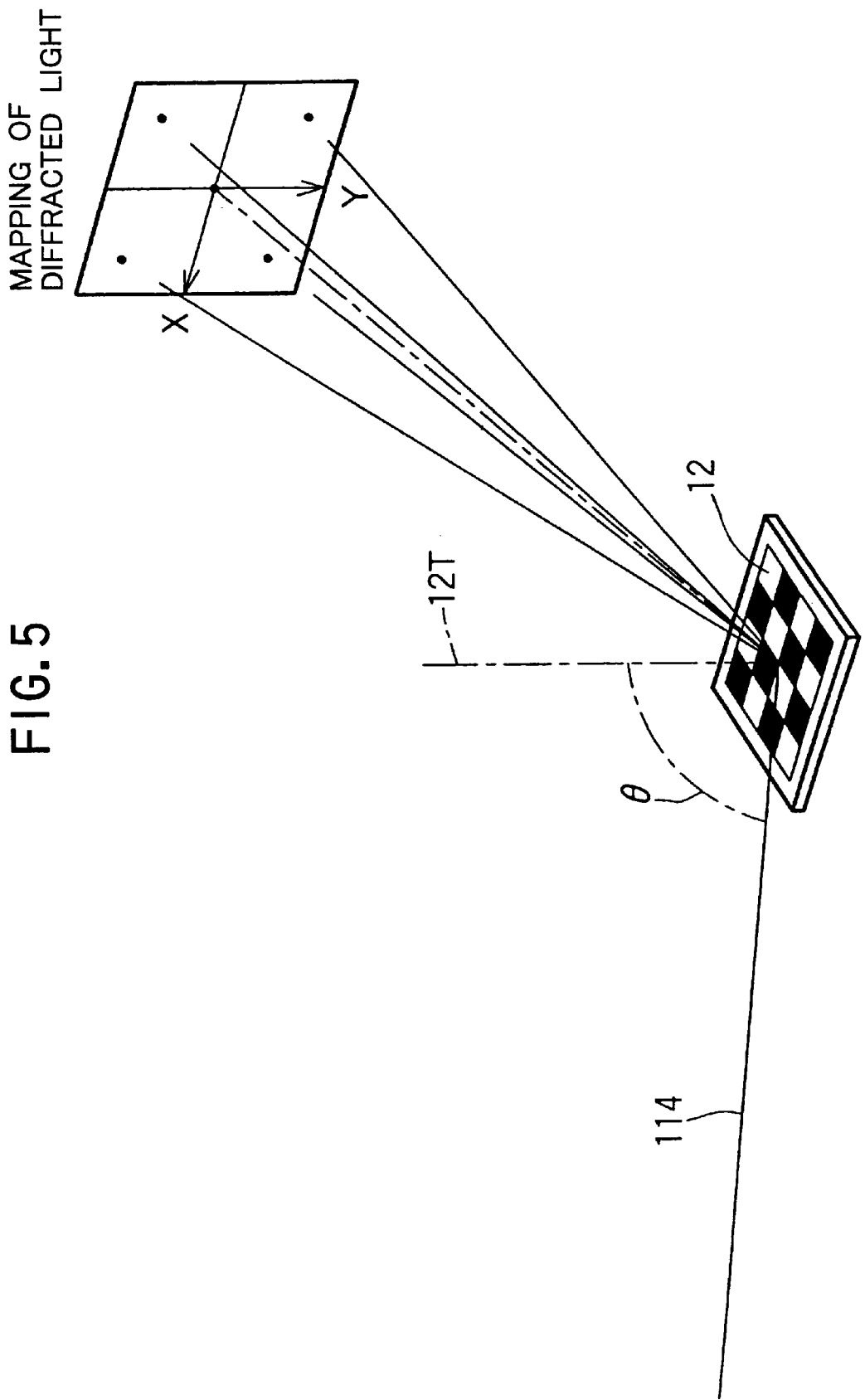
FIG. 5 illustrates a mapping of diffracted lights in the first plane position measurement illuminating beam due to the two-dimensional diffraction pattern on an object in the position measuring apparatus of the present invention.
Figure 6:
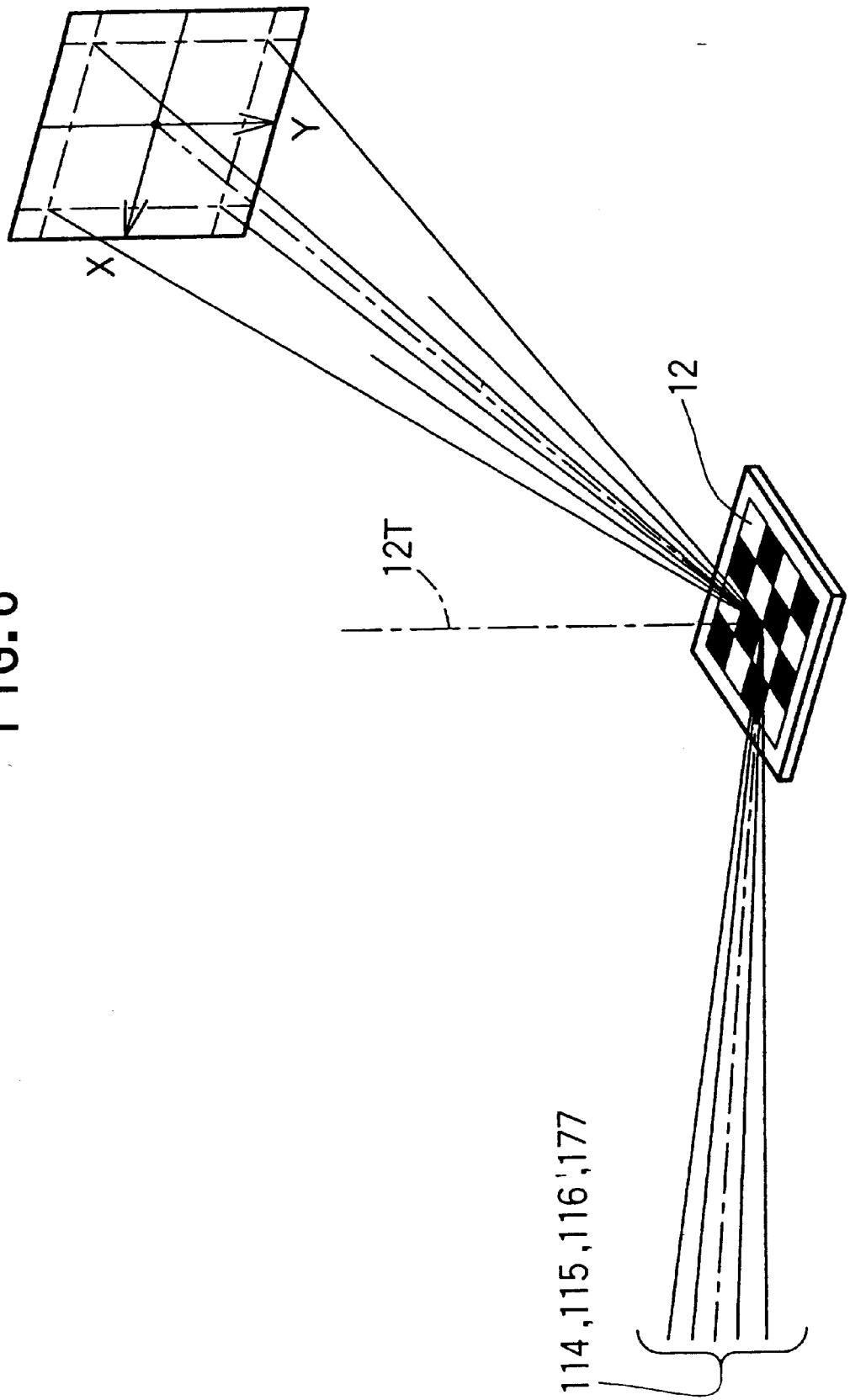
FIG. 6 is a perspective view of the measurement illuminating beam entering the two-dimensional diffraction pattern on the object in the position measuring apparatus of the present invention.

Mappings of the regular reflection light (zero-order diffracted light) and one-order diffracted light of the first plane position measurement illuminating beam that meet the first and second formulas are shown in FIGS. 5 and 6 (two and higher-order diffracted lights being omitted).

FIG. 5 shows that the first plane position measurement illuminating beam 114 enters the two-dimensional pattern 12 on the object 10 with an angle θ relative to a normal 12T on the two-dimensional pattern 12.

FIG. 6 shows that all the four measurement illuminating beams 114–117 enter the two-dimensional pattern 12 on the object 10.

Figure 7:
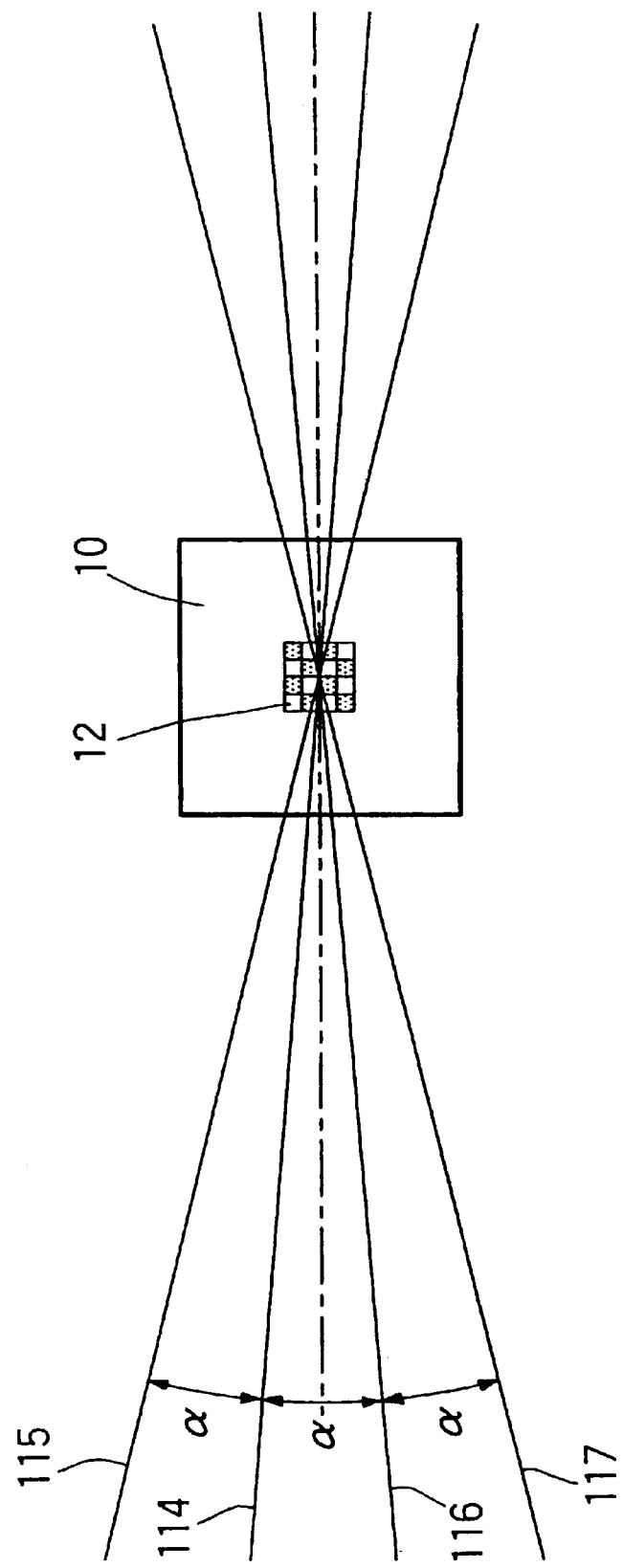
FIG. 7 is a plan view of the measurement illuminating beam entering the two-dimensional diffraction pattern on the object in the position measuring apparatus of the present invention.
Figure 8:
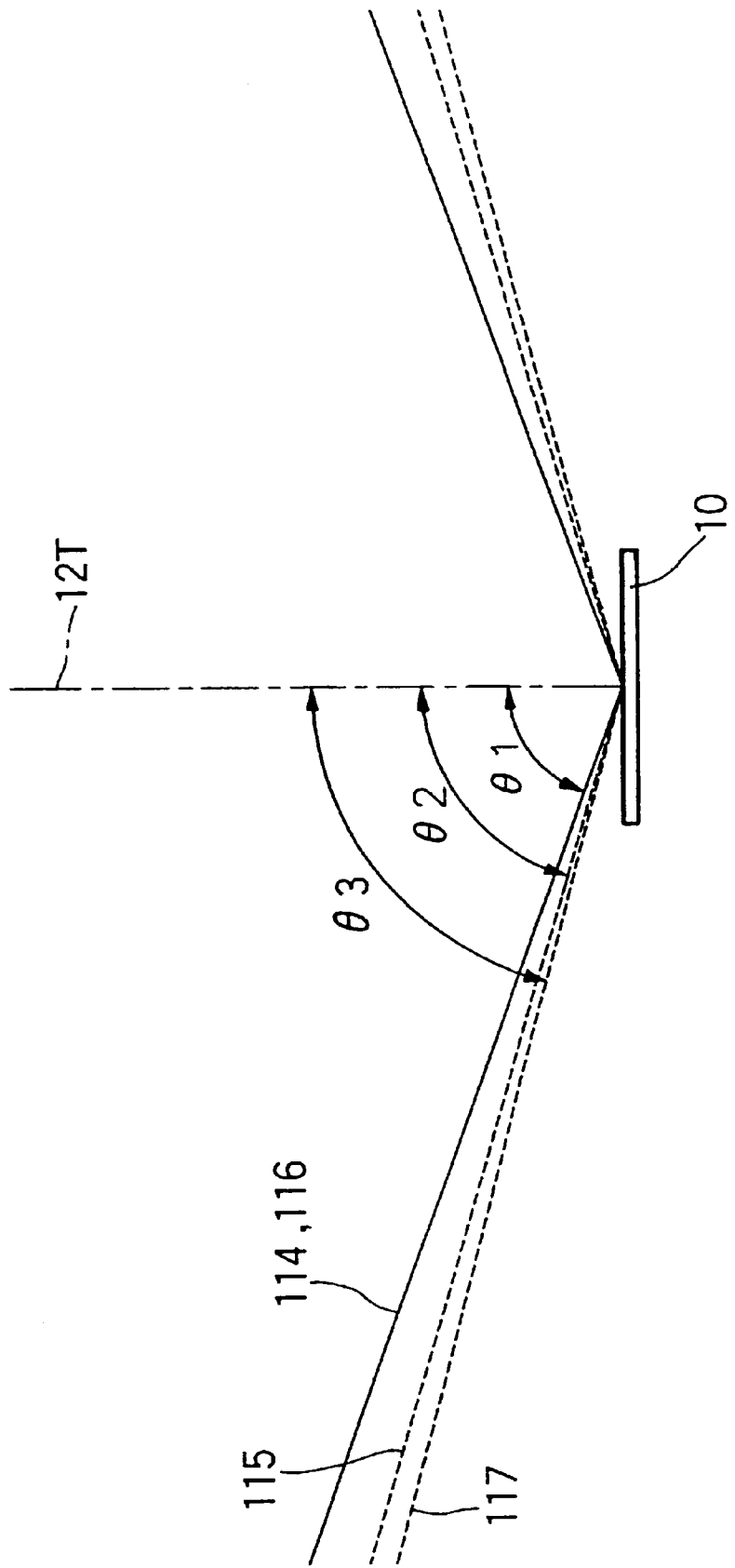
FIG. 8 is a side view of the measurement illuminating beam entering the two-dimensional diffraction pattern on the object in the position measuring apparatus of the present invention.

As shown in FIGS. 7 and 8, the first and second plane position measurement illuminating beams 114, 116 and the first and second normal-direction measurement illuminating beams 115, 117 enter the two-dimensional pattern on the object after they have been rotated relative to one another about the object plane normal with a slight angle+α. Therefore, the zero- and one-order diffracted lights of the respective illuminating beam will not be superimposed over those of the other illuminating beams and can separately be taken out.

With respect to the incident angle, as shown in FIG. 8, the first and second plane position measurement illuminating beams 114, 116 enter the two-dimensional pattern 12 on the object 10 with the incident angle θ1; the first normal-direction measurement illuminating beam 115 with the incident angle θ2; the second normal-direction measurement illuminating beam 117 with the incident angle θ3.

Figure 9:
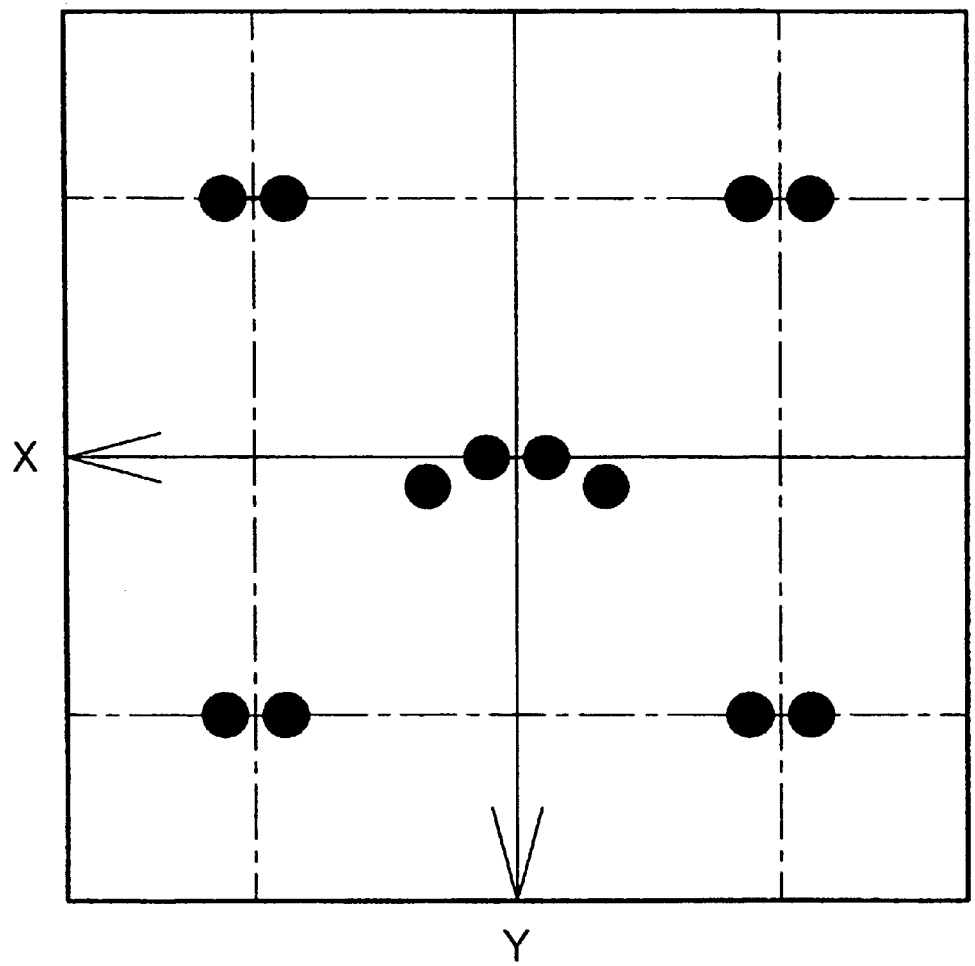
FIG. 9 illustrates a mapping of diffracted lights in the plane-position and normal-direction measuring illumination beams due to the two-dimensional diffraction pattern in the position measuring apparatus of the present invention.

FIG. 9 is a mapping of the zero- and one-order diffracted lights of the first and second plane position measurement illuminating beams 114, 116 and the zero-order diffracted lights of the first and second normal-direction measurement illuminating beams 115, 117. In FIG. 9, the first and higher-order diffracted lights of the first and second normal-direction measurement illuminating beams 115, 117 being omitted.

In this embodiment, as shown in FIGS. 5, 6 and 9, its coordinate system is different from the general coordinate systems because the mapping of diffracted light is of reflective diffraction such that the forward direction of the X axis is leftward as viewed in these figures while the forward direction of the Y axis is downward as viewed in these figures.

Figure 10:
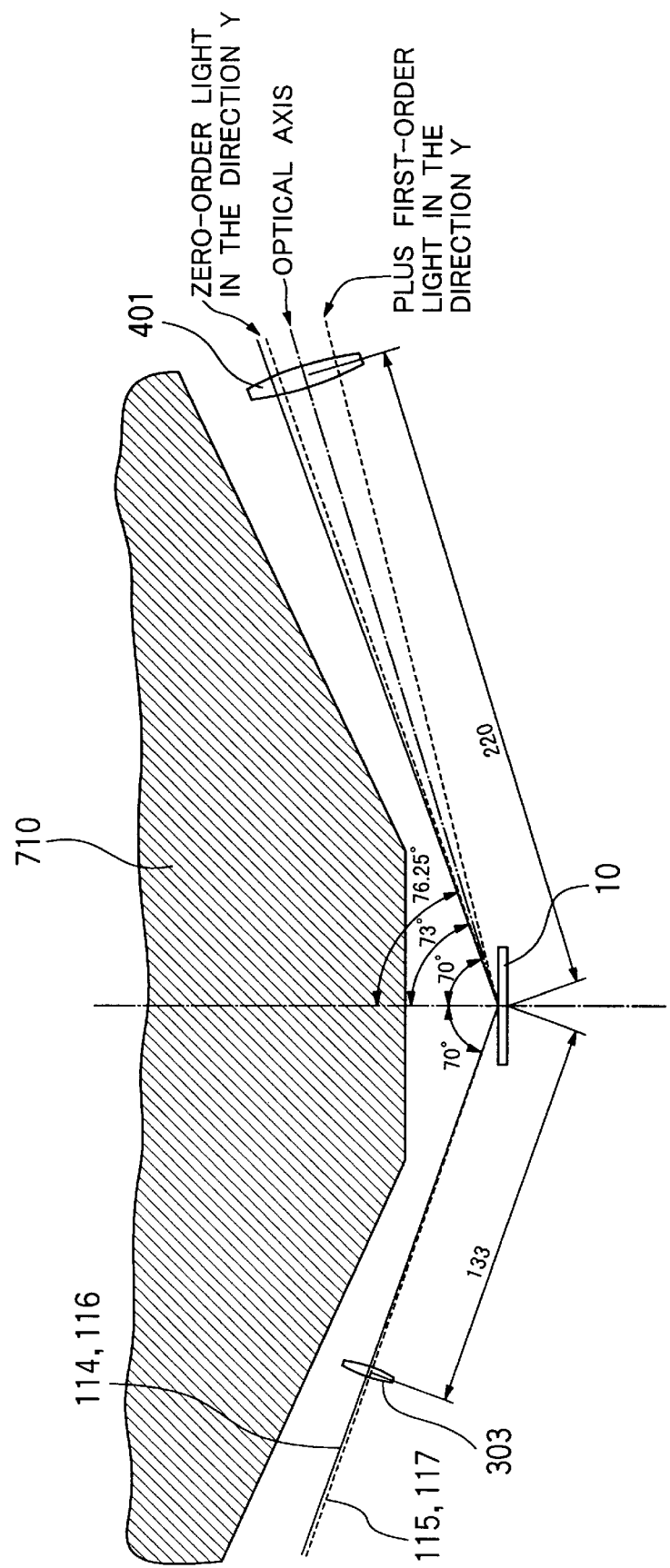
FIG. 10 is a side view illustrating the positional relationship between the plane position measurement illuminating beam, the normal-direction measurement illuminating beam and their diffracted lights and the apparatus components.
Figure 11:
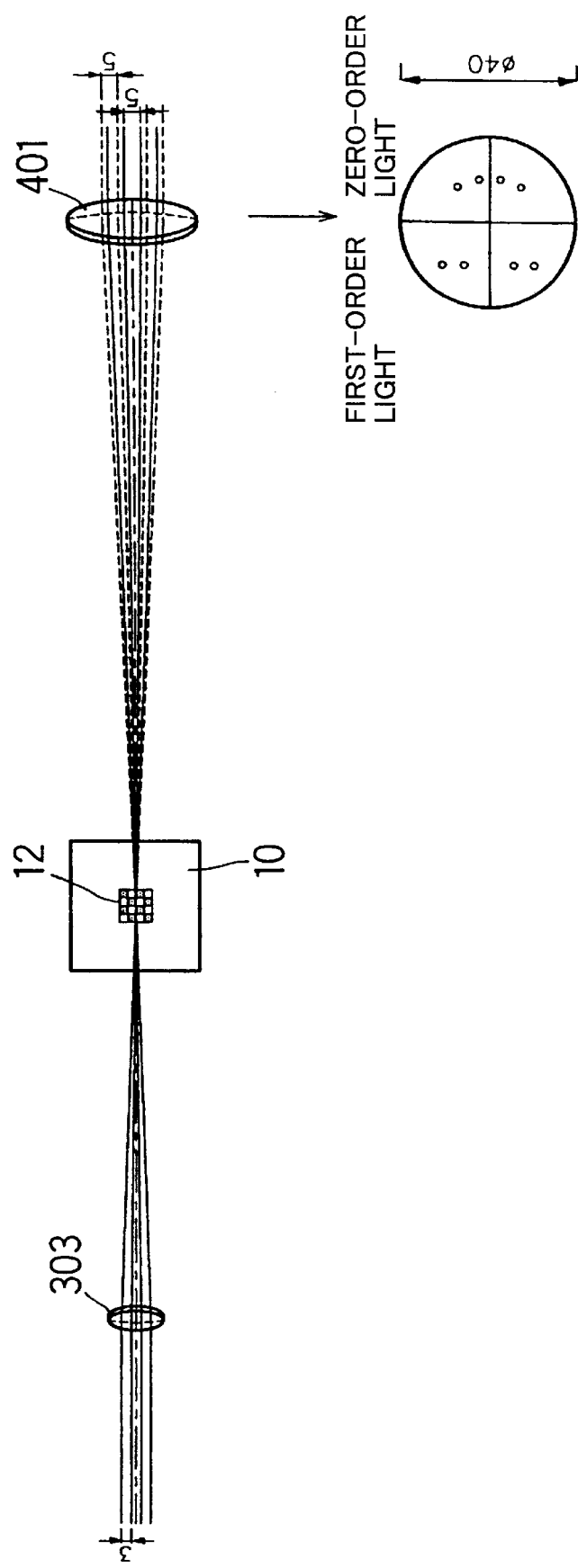
FIG. 11 is a plan view illustrating the positional relationship between the plane position measurement illuminating beam, the normal-direction measurement illuminating beam and their diffracted lights and the apparatus components.

As shown in FIGS. 10, 11 and 19, the light-reception optical system 400 is disposed to receive diffracted lights that are spread out from a reflection point on the two-dimensional pattern. In the electron beam lithography system and steppers, however, a space receiving the light-reception optical system is often limited since the space is substantially occupied by a system component 710 such as a drawing or projecting optical system.

It is thus required that the angle of diffraction determining the magnitude of the entire light-reception optical system can be reduced and that the diffracted lights at the light-receiving unit are spaced apart from one another with suitable distances such that they can easily be divided or superimposed. As in the light-reception optical system, the illumination optical system must also be located within a limited space that is occupied by the system component.

On the side of the light-reception optical system, the angle of Y direction diffraction of the zero-order light is equal to the incident angle θ. Referring to the second formula with respect to the angle of Y direction diffraction θy of the one-order diffracted light, the value θy meeting the composite minus formula is smaller than θ. In other words, minus one-order diffracted light tends to be blocked by a system member such as a drawing or projecting optical system since it appears on the side of such a system member from the zero-order diffracted light.

In such a case, the position of beam passage on the side of the light-reception optical system becomes asymmetrical to that on the side of the illumination optical system. If it is so set that the minus one-order light will not be blocked by the inherent system component, the incident angle θ on the incident side will be increased to form a dead zone.

If the incident angle θ is increased, the differential diffraction efficiency between the polarized light components (S polarized light and P polarized light) in the reflected and diffracted light also is increased. This affects the superposition interference at the light-receiving unit.

However, the angle θy meeting the second composite plus formula is larger than θ while plus one-order diffracted light appears on the side of the object from the zero-order diffracted light. If the zero-order diffracted light is not blocked by the component, therefore, the plus one-order diffracted light will not also be blocked by the system component 710. If the plus one-order diffracted light is used, consequently, the incident angle θ can be set at the minimum value within the range of not-blocking to reduce the differential diffraction efficiency due to the polarized light components.

The one-order diffracted lights meeting the second composite plus formula and the first formula include plus one-order diffracted light in the X direction, plus one-order diffracted light in the Y direction, minus one-order diffracted light in the X direction and plus one-order diffracted light in the Y direction. These diffracted lights are contained in quadrants adjacent to each other ((X, Y) quadrant and (–X, Y) quadrant). If these light rays are used, therefore, they can contribute the saving of space on the side of the light-reception optical system.

Figure 14:
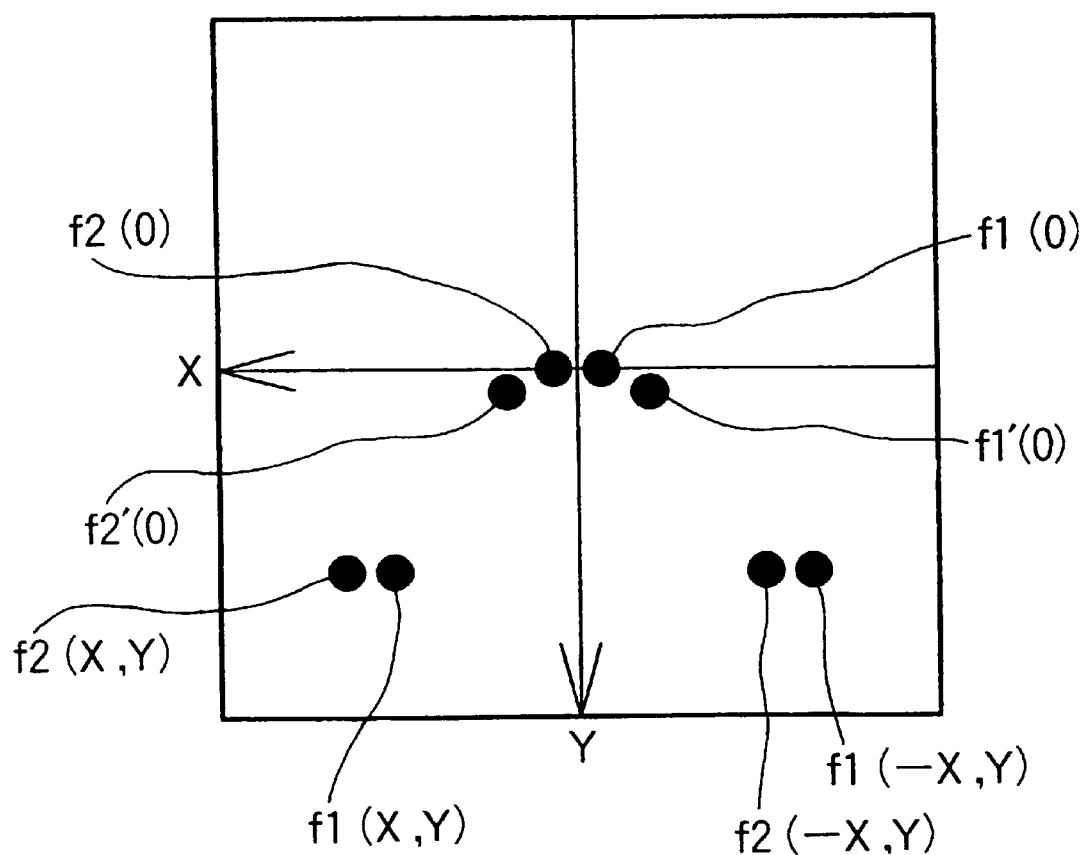
FIG. 14 is a mapping of diffracted lights used to perform X, Y and Z direction measurements among diffracted lights at the alignment mark in the position measuring apparatus of the present invention.

FIG. 14 shows a mapping of diffracted light which is used to measure the diffracted lights diffracted at the alignment mark in the X, Y and Z directions.

In this figure, f1(0) is a zero-order diffracted light created after the first plane position measurement illuminating beam 114 has been diffracted at the alignment mark and f2(0) is a zero-order diffracted light produced after the second plane position measurement illuminating beam 116 has been diffracted at the alignment mark.

f1(X, Y) are plus one order diffracted lights in the respective X and Y directions which are produced after the first plane position measurement illuminating beam 114 has been diffracted at the alignment mark.

f1(–X, Y) are minus and plus one-order diffracted lights in the respective X and Y directions which are created after the first plane position measurement illuminating beam 114 has been diffracted at the alignment mark.

f2(X, Y) are plus one-order diffracted lights in the respective X and Y directions which are produced after the second plane position measurement illuminating beam 116 has been diffracted at the alignment mark.

f2(–X, Y) are minus and plus one-order diffracted lights in the respective X and Y directions which are created after the second plane position measurement illuminating beam 116 has been diffracted at the alignment mark.

f1'(0) is a zero-order diffracted light produced after the first normal-direction measurement illuminating beam 115 has been diffracted at the alignment mark.

f2'(0) is a zero-order diffracted light produced after the second normal-direction measurement illuminating beam 117 has been diffracted at the alignment mark.

Another method for reducing the size of the light-reception optical system is to reduce the lens diameter. For such a purpose, the differential angle of diffraction between the zero- and one-order diffracted lights may be reduced. This may be accomplished by increasing the pitch in the two-dimensional diffraction pattern based on the first and second formulas or by decreasing the wavelength $\lambda$ in the light source.

The pitch in the diffraction pattern is usually in the range of several $\mu$m to several tens $\mu$m. If He-Ne laser light source of wavelength $\lambda=633$ nm is used, the angle of diffraction can sufficiently be reduced. Resist is often applied to the surface of the object. Such a wavelength is sufficient not to sensitize the resist.

If it is assumed that an angle included between the optical axis of an objective lens 401 and the normal in the object is $\beta$, an angle included between the zero-order diffracted light of the first illuminating beam and the normal in the object is $\theta$, the angle of diffraction of the plus one-order diffracted light of the first illuminating beam in the Y direction is $\theta y$, the following relationship will be given:

$$\beta=(\theta+\theta y)/2.$$

This angle $\beta$ is one intermediate between those of the zero- and one-order diffracted lights. By taking this optical axis, the lens diameter can be reduced even if the lens is located at a position farther than the object. As the distance between the reflection point on the object and the objective lens increases, the spacing between the respective adjacent diffracted lights correspondingly increases. This is also advantageous in that the division and superposition interference of the diffracted lights at the light-receiving unit can be facilitated.

FIG. 10 exemplifies light-projection and light-reception optical systems in which the wavelength $\lambda$ is 633 nm; the incident angle $\theta$ of the first and second plane position measurement illuminating beams 114, 116 is 70 degrees; the pitch in the checked grid is 20 $\mu$m; the focal distance of an irradiating lens 303 is 133 mm; and the focal distance of the light-reception side objective lens is 220 mm.

Since the four illuminating beams entering the irradiating lens 303 are parallel to one another and spaced apart from one another with a spacing equal to 3 mm, such a spacing is increased to about 5 mm after they have passed through the light-reception side objective lens 401.

With respect to the angle of diffraction of the one-order diffracted light, it is found from the first and second formulas that $\theta x$ is equal to 1.8 degrees and $\theta y$ is equal to 76.25 degrees. The angle $\beta$ of the optical axis in the light-reception side objective lens 401 is 73 degrees. At this time, the lens diameter $\phi$ becomes 40 mm. Thus, the four illuminating beams can pass through the lens without impact against the component 710.

The light-reception side objective lens 401 is disposed at a position spaced apart from the reflection point on the object 10 by a distance corresponding to one focal distance and serves to parallelize a number of reflection diffracted lights spread out from the reflection point on the object 10. The diffracted lights parallelized by the light-reception side objective lens 401 are then conducted to the light-receiving unit through return mirrors 402 and 403. Further, the zero- and plus one-order diffracted lights in the direction Y are collected in the same plane through the other return mirrors 404 and 405.

Figure 12:
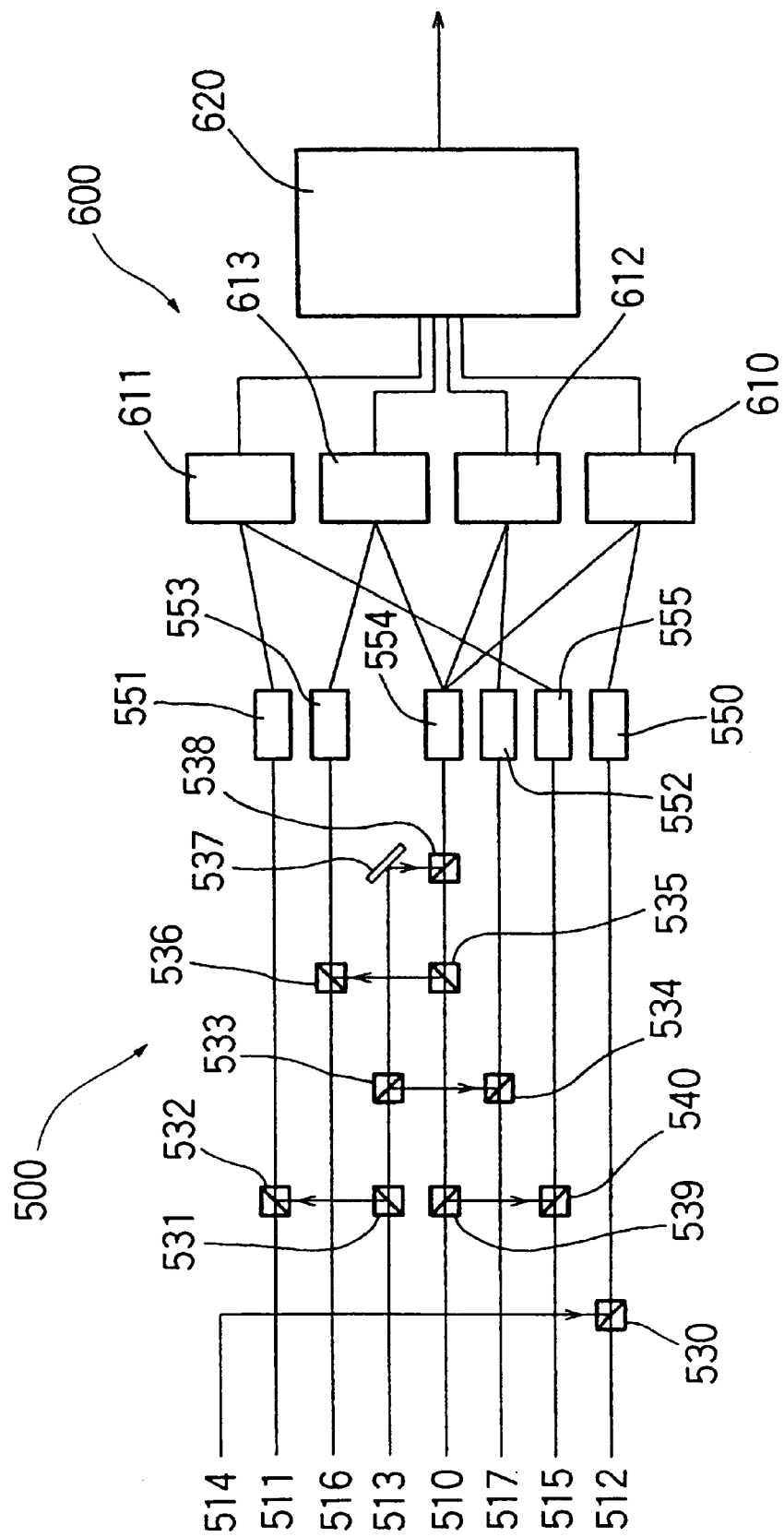
FIG. 12 is a schematic block diagram of a light-reception optical system in the position measuring apparatus of the present invention.

The details of the light-receiving unit 500 are shown in FIG. 12. The light-receiving unit is designed to form a position measuring interference measurement signal in the plane including the object from a combination of higher- and zero-order diffracted lights of the first and second plane position measurement illuminating beams 114, 116 received by the light-reception optical system 400 which are included in the adjacent quadrants, (+X, +Y) and (−X, +Y) quadrants due to the aforementioned two-dimensional pattern and at least one combination of higher-order diffracted lights different in frequency from each other.

X-direction position measuring interference measurement signal in the plane including the object is formed by superimposing a minus and plus one-order diffracted light in the respective X and Y directions among the diffracted lights of the first plane position measurement illuminating beam 114 due to the two-dimensional pattern on a plus one-order diffracted light 514 in both the X and Y directions among the diffracted lights of the second plane position measurement illuminating beam 116 due to two-dimensional pattern by means of a beam splitter 530. X-direction position measuring interference signal is received by a photosensor 550.

Y-direction position measuring interference measurement signal in the plane including the object is formed by superimposing a plus one-order diffracted light in both the X and Y directions among the diffracted lights of the first plane position measurement illuminating beam 114 due to the two-dimensional pattern on light ray divided from zero-order diffracted light 513 of the second plane position measurement illuminating beam 116 through a beam splitter 531 by means of a beam splitter 532. Y-direction position measuring interference measurement signal is received by a photosensor 551.

First Z-direction position measuring interference measurement signal obtained by irradiating the plane including the object in the normal or Z direction with the irradiation angle $\theta2$ is formed by superimposing light ray divided from a zero-order diffracted light 513 of the second plane position measurement illuminating beam 116 through a beam splitter 533 on a zero-order diffracted light 517 of the first normal-direction measurement illuminating beam 115 by means of a beam splitter 534. Z-direction position measuring interference signal is received by a photosensor 552.

Second Z-direction position measuring interference measurement signal obtained by irradiating the plane including the object in the normal or Z direction with the irradiation angle $\theta3$ is formed by superimposing light ray divided from a zero-order diffracted light 510 of the first plane position measurement illuminating beam 116 through a beam splitter 535 on a zero-order diffracted light 516 of the second normal-direction measurement illuminating beam 115 by means of a beam splitter 536. Z-direction position measuring interference signal is received by a photosensor 553.

The light-receiving unit further superimposes the zero-order light 510 of the first plane position measurement illuminating beam 114 on the zero-order light 513 of the second plane position measurement illuminating beam through a beam splitter 538 to form an X and Z position measuring interference reference signal which is in turn received by a photosensor 554.

Light ray divided from the zero-order light 510 of the first plane position measurement illuminating beam 114 through a beam splitter 539 are superimposed on a minus and plus one-order diffracted light 515 in the respective X and Y directions among the diffracted lights of the second plane position measurement illuminating beam 116 due to the two-dimensional pattern by means of a beam splitter 540 to form a Y-direction position measuring interference reference signal which is in turn received by a photosensor 555.

The interference measurement and interference reference signals are beat signals due the superposition interference or heterodyne interference between two light rays slightly different infrequency from each other. It is now assumed that the frequency of the first plane position and normal-direction measurement illuminating beams (both of which will be called "first measuring beams") is f1 and the frequency of the second plane position and normal-direction measurement illuminating beams (both of which will be called "second measuring beams") is f2.

It is further assumed that a complex amplitude of a diffracted light among a number of diffracted lights of each of the beams due to two-dimensional diffraction pattern is represented by:

$$a1 = A1 \times \exp[-i(2\pi f1 t + \phi1)]$$

and $$a2 = A2 \times \exp[-i(2\pi f2 t + \phi2)]$$

where $\phi1$ is the initial phase of the first illuminating beam, $\phi2$ is the initial phase of the second illuminating beam and t is time.

An intensity signal used to superimpose these light rays is $$I = A1 \times A1 + A2 \times A2 + 2 A1 \times A2 \times \cos[2\pi \Delta f t + (\phi1 - \phi2)]$$

where $\Delta f = f1 - f2$.

This is a beat signal having its frequency of $\Delta f$ with the phase component thereof being $$\phi1 - \phi2 \quad (3).$$

Now note a plus one-order diffracted light in both the X and Y directions among a number of higher-order diffracted lights of the first and second illuminating beams due to the two-dimensional pattern on the object. When the object including the two-dimensional diffraction pattern is displaced by $\Delta X$ in the X direction and by $\Delta Y$ in the Y direction, the phase of this diffracted light is changed by:

$$2\pi(\Delta X + \Delta Y)/d = \phi x + \phi y$$

in both the first and second illuminating beams. The value d represents the pitch in the two-dimensional diffraction pattern and is equal to $\phi z$ since the phase is changed even by the movement of the object in the z direction.

Thus, the change of phase in this diffracted light is $$\phi x + \phi y + \phi z \quad (4)$$

when the object is moved in all the X, Y and Z directions.

A minus and plus one-order diffracted light in the respective X and Y directions has $\phi x$ changed in sign and the change of phase when the object is displaced in the X, Y and Z directions is $$-\phi x + \phi y + \phi z \quad (5).$$

The phase of the zero-order light will not be changed for displacement of the object in the X and Y directions and will only be changed for displacement of the object in the Z direction. However, the normal-direction measurement illuminating beam among the first and second illuminating beams has a different change of phase for the displacement $\Delta Z$ of the object in the Z direction due to its different incident angle.

The changes of phase $\phi z$ and $\phi z'$ in the first and second illuminating beams for displacement of the object in the Z direction are given by $$\phi z = 4\pi \Delta Z/\lambda \times \cos\theta1 \quad (6)$$

$$\phi z' = 4\pi \Delta Z/\lambda \times \cos\theta2 \quad (7).$$

The phase component of the X-direction position measuring interference measurement signal is given by $$(\phi x + \phi y + \phi z) - (-\phi x + \phi y + \phi z) = 2\phi x \quad (8)$$

when the fourth formula is substituted for $\phi1$ in the third formula and the fifth formula is substituted for $\phi2$.

The phase component of the X-direction position measuring interference reference signal is given by $$\phi z - \phi z = 0 \quad (9)$$

when the sixth formula is substituted for $\phi1$ and $\phi2$ in the third formula.

Thus, the eighth formula for the X position measuring interference measurement signal and the ninth formula for the X position measuring interference reference signal equally contain positional information in the Y direction (in this case, zero). The difference between the eighth and ninth formulas is 2 $\phi x$. Thus, positional information in the X direction within the plane including the object can be provided.

The phase component of the Y position measuring interference measurement signal is given by $$(\phi x + \phi y + \phi z) - \phi z = \phi x + \phi y \quad (10)$$

from the fourth and sixth formulas.

The phase component of the Y position measuring interference reference signal is given by $$\phi z - (-\phi x + \phi y + \phi z) = \phi x - y \quad (11)$$

from the fifth and sixth formulas.

Thus, the tenth formula for the Y position measuring interference measurement signal and the eleventh formula for the Y position measuring interference reference signal equally contain positional information in the X direction. The difference between the tenth and eleventh formulas is 2 $\phi y$. Thus, positional information in the Y direction within the plane including the object can be provided.

Further, the phase component of the first Z position measuring interference measurement signal is $$\phi z' - \phi z = 4\pi(\cos\theta2 - \cos\theta1)/\lambda \times \Delta z \quad (12)$$

while the phase component of the second Z position measuring interference measurement signal is $$\phi z' - \phi z = 4\pi(\cos\theta3 - \cos\theta1)/\lambda \times \Delta z \quad (13).$$

This is proportional to $\Delta Z$.

The phase component of the Z and X position measuring interference reference signal is zero from the ninth formula.

Therefore, when the difference between the twelfth and ninth formulas is taken, positional information in the Z direction (or in the normal direction relative to the plane including the object) can be provided directly from the twelfth formula.

Phase difference $\phi z1$ ($\Delta Z$) between the first Z position measuring interference signal and the Z position measuring interference reference signal and phase difference $\phi z2$ ($\Delta Z$) between the second Z position measuring interference signal and the Z position measuring interference reference signal are given, from the twelfth and thirteenth formulas, by $$\Phi z1(\Delta Z)=4\pi(\cos\theta 1-\cos\theta 2)/\lambda\times\Delta Z$$

and $$\Phi z2(\Delta Z)=4\pi(\cos\theta 1-\cos\theta 3)/\lambda\times\Delta Z.$$

It is assumed herein that the z position measuring interference signal is subtracted from the Z position measuring interference reference signal (and, in other word, signs the brackets are inverted).

It is now assumed that the detection stroke of the first Z position measuring interference signal is Z1 and the detection stroke of the second position measuring interference signal is Z2 (Z1>Z2).

Figure 13:
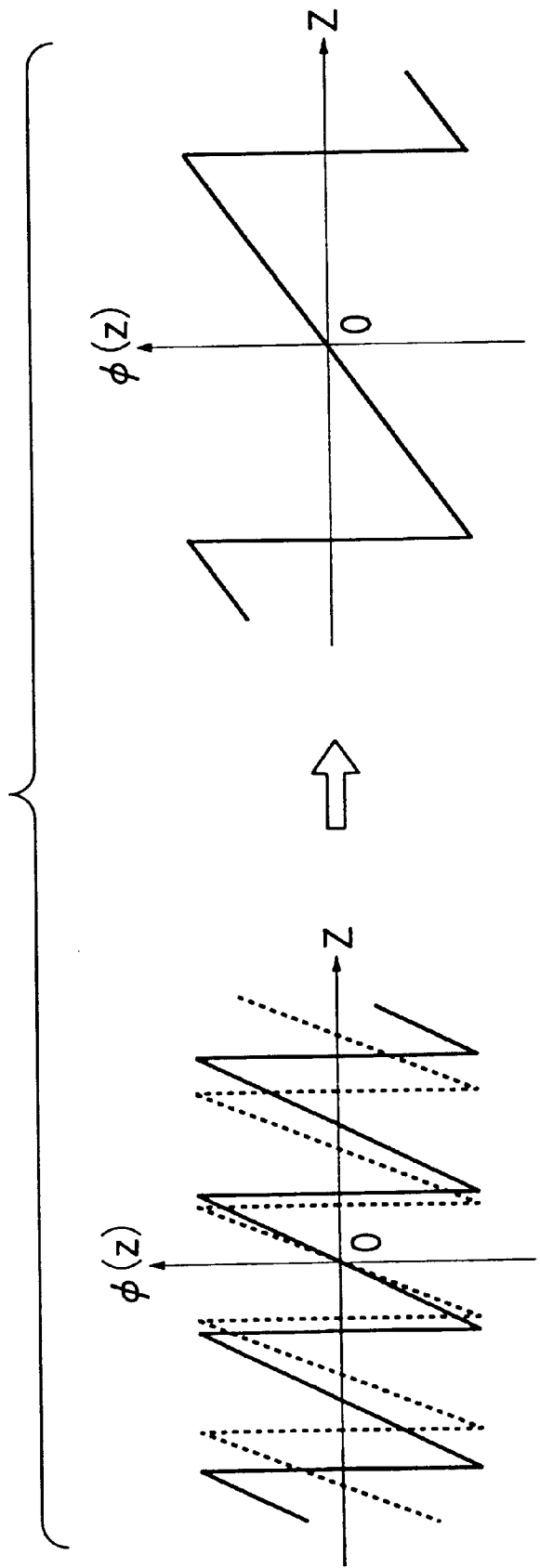
FIG. 13 is signal waveforms in the position measuring apparatus of the present invention.

Since at $\Delta Z=Z1$, $\phi z1$ ($\Delta Z$)=2 $\pi$, and at $\Delta Z=Z2$, $\phi z2$ ($\Delta Z$)=2 $\pi$, $$\Phi z1(\Delta Z)=2\pi/Z1\times\Delta Z \quad (a)$$

$$\Phi z2(\Delta Z)=2\pi/Z2\times\Delta Z \quad (b)$$

are provided. In the left-side waveform of FIG. 13, a solid line indicates a signal from the formula (a) and a broken line denotes a signal from the formula (b).

When the difference between $\phi z2$ ($\Delta Z$) and $\phi z1$ ($\Delta Z$) or between the formulas (a) and (b) is taken, $$\Delta\Phi(\Delta Z)=2\pi(1/Z2-1/Z1)\times\Delta Z$$

$$=2\pi(Z1-Z2)/(Z1\times Z2)\times\Delta Z \quad (c).$$

Comparing the formulas (a) and (b) with the formula (c), it is believed that the formula (c) represents the Z position measuring interference signal of Z1×Z2/(Z1−Z2). The signal from this formula (c) is shown by the right-side waveform of FIG. 13.

If it is assumed that $\theta 2$ and $\theta 3$ are respectively equal to 70.39 and 70.48 degrees, Z1 and Z2 become equal to 50 $\mu$m and 40 $\mu$m, respectively. These values are substituted for the formula (c) to provide $$\Delta\Phi(\Delta Z)=2\pi/200\ \mu m\times\Delta Z.$$

Thus, the Z position measuring interference signal having its stroke equal to 200 $\mu$m can be obtained. At this time, the number of samples is equal to 2000 as in the case wherein the stroke is equal to 50 $\mu$m and the resolving power is 25 nm. In other words, the detection stroke or detectable range can be enlarged to 200 $\mu$m while maintaining the resolving power 25 nm and the number of samples 2000.

Although it was assumed that for convenience, the position measuring interference reference signals in the respective directions were obtained from the ninth formula in the X direction, from the eleventh formula in the Y direction and from the ninth formula in the Z direction, the positional information in the respective directions may be obtained even if the X direction relates to the eight formula, the Y direction to the tenth formula and the Z direction to the twelfth formula so that the signs are only inverted.

From the thirteenth formula can be determined the incident angle $\theta 2$ in the first normal-direction measurement illuminating beam for obtaining a desired Z detection stroke.

For example, if one desires to obtain a desired detection stroke of 50 $\mu$m from the thirteenth formula, 2 $\pi$ is substituted for the left part thereof and 50 $\mu$m is substituted for $\Delta z$ in the right part thereof.

Since the value of $\theta 2$ is to be larger than $\theta 1$, that is, the value $\theta 2$ is to be located nearer the object side than the first illuminating beam, the first z position measuring interference reference signal is subtracted from the second Z position measuring interference reference signal to provide $$2\pi=4\pi(\cos 70\text{ degrees}-\cos\theta 2)/633\text{ nm}\times 50\ \mu m.$$

From this formula, it is found that $\theta 2$ is equal to 70.39 degrees.

The signal processing unit 600 is designed to determine the position of the object in the plane including the object and the normal-direction position of the object relative to the plane including the object from the phases of the position measuring interference signals. The X-direction position measuring interference measurement signal is received by a photosensor 550 while the X-direction position measuring interference reference signal is received by a photosensor 554. The phase difference between the signals received by the photosensors 550 and 554 is measured by a phase meter 610.

The Y position measuring interference measurement signal is received by a photosensor 551 while the Y position measuring interference reference signal is received by a photosensor 555. The phase difference between the signals received by the photosensors 551 and 555 is measured by a phase meter 611.

The first Z-direction position measuring interference measurement signal is received by a photosensor 552 while the Z position measuring interference reference signal is received by a photosensor 554.

The phase difference between the signals received by the photosensors 552 and 554 is measured by a phase meter 612.

The second Z-direction position measuring signal is received by a photosensor 553 while the Z-direction position measuring interference reference signal is received by a photosensor 554.

The phase difference between the signals received by the photosensors 553 and 554 is measured by a phase meter 613.

A processing unit 620 is designed to determine the X-direction position of the object in the plane including the object based on the phase difference from the phase meter 610, to determine the Y-direction position of the object in the plane including the object based on the phase difference from the phase meter 611, and to determine the Z-direction position of the object in the plane including the object based on the phase differences from the phase meters 612 and 613. Thus, the processing unit 620 can separately measure the displacement components in the respective directions when the object is displaced in the X, Y and Z directions. Consequently, various controls including the alignment of the object and others can be accomplished by the present invention.

4 Application of the Position Measuring Apparatus According to the Present Invention The position measuring apparatus of the present invention may be applied to any of various systems which are required to perform the precise alignment of the object, such as charged particle beam systems as represented by an electron beam lithography system and semiconductor aligner.

Figure 15:
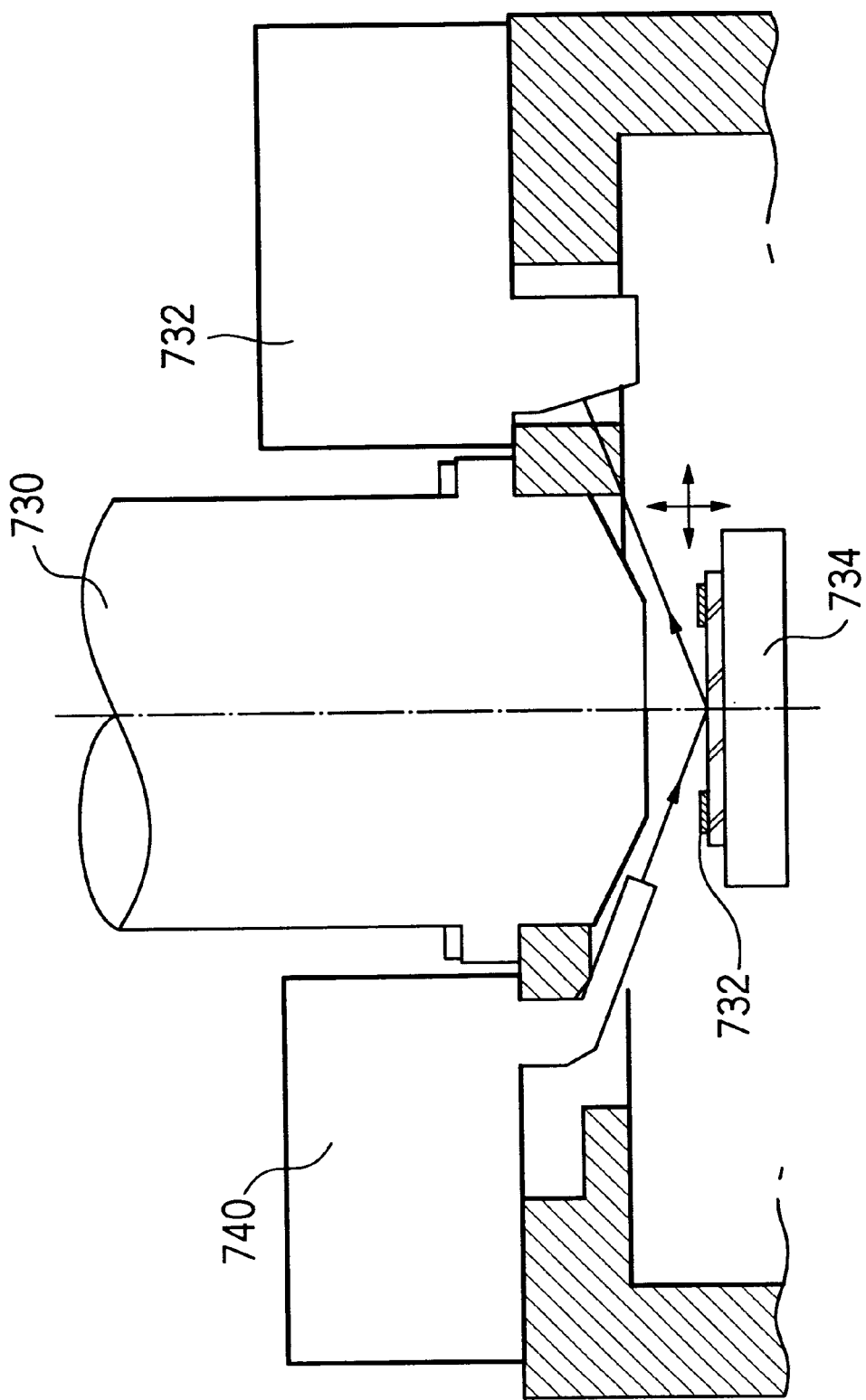
FIG. 15 is a schematic side view, partially broken apart, of an electron beam lithography system to which the position measuring apparatus of the present invention is applied.
Figure 16:
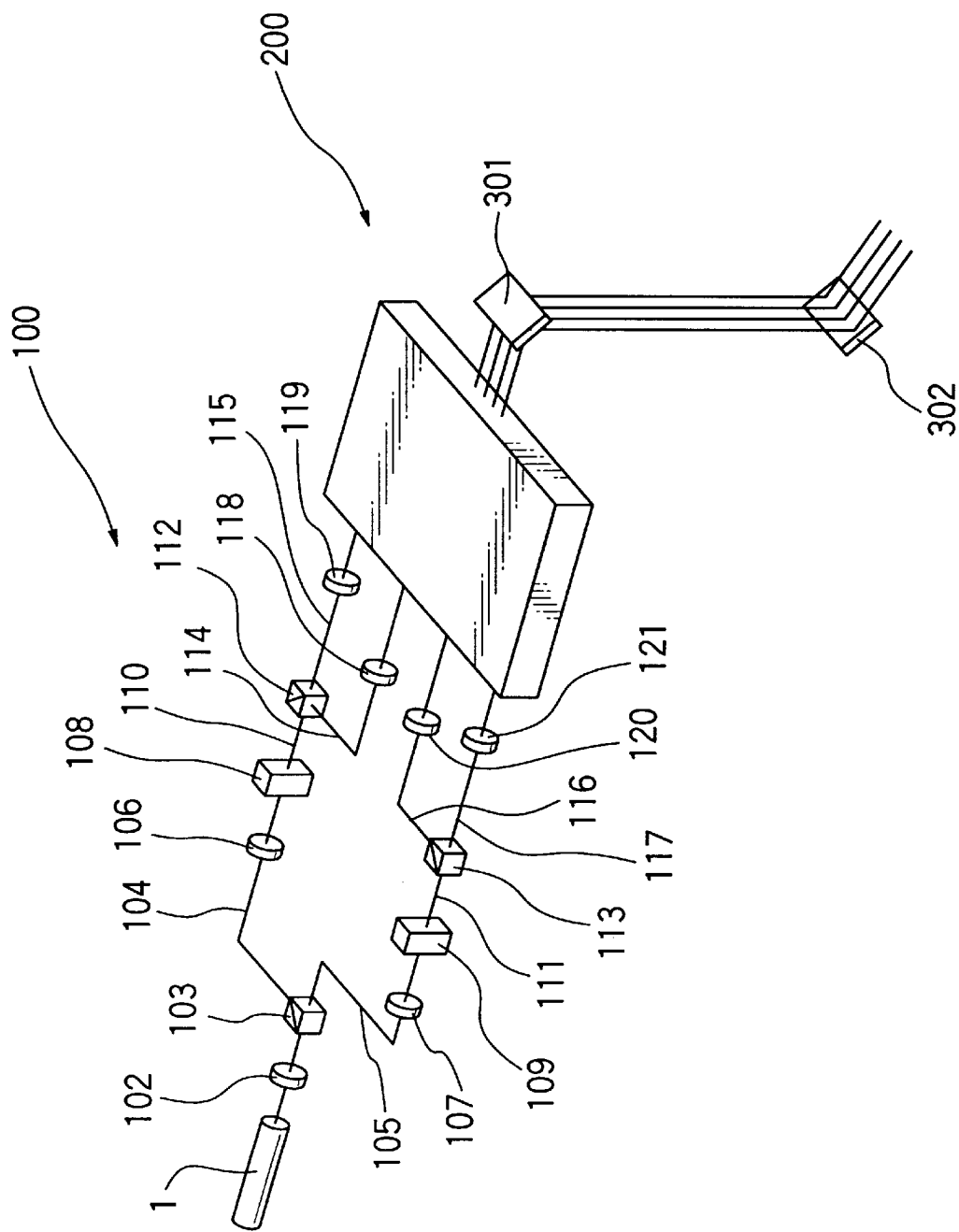
FIG. 16 is a fragmentary view, in an enlarged scale, of the illumination optical system shown in FIG. 1.
Figure 17:
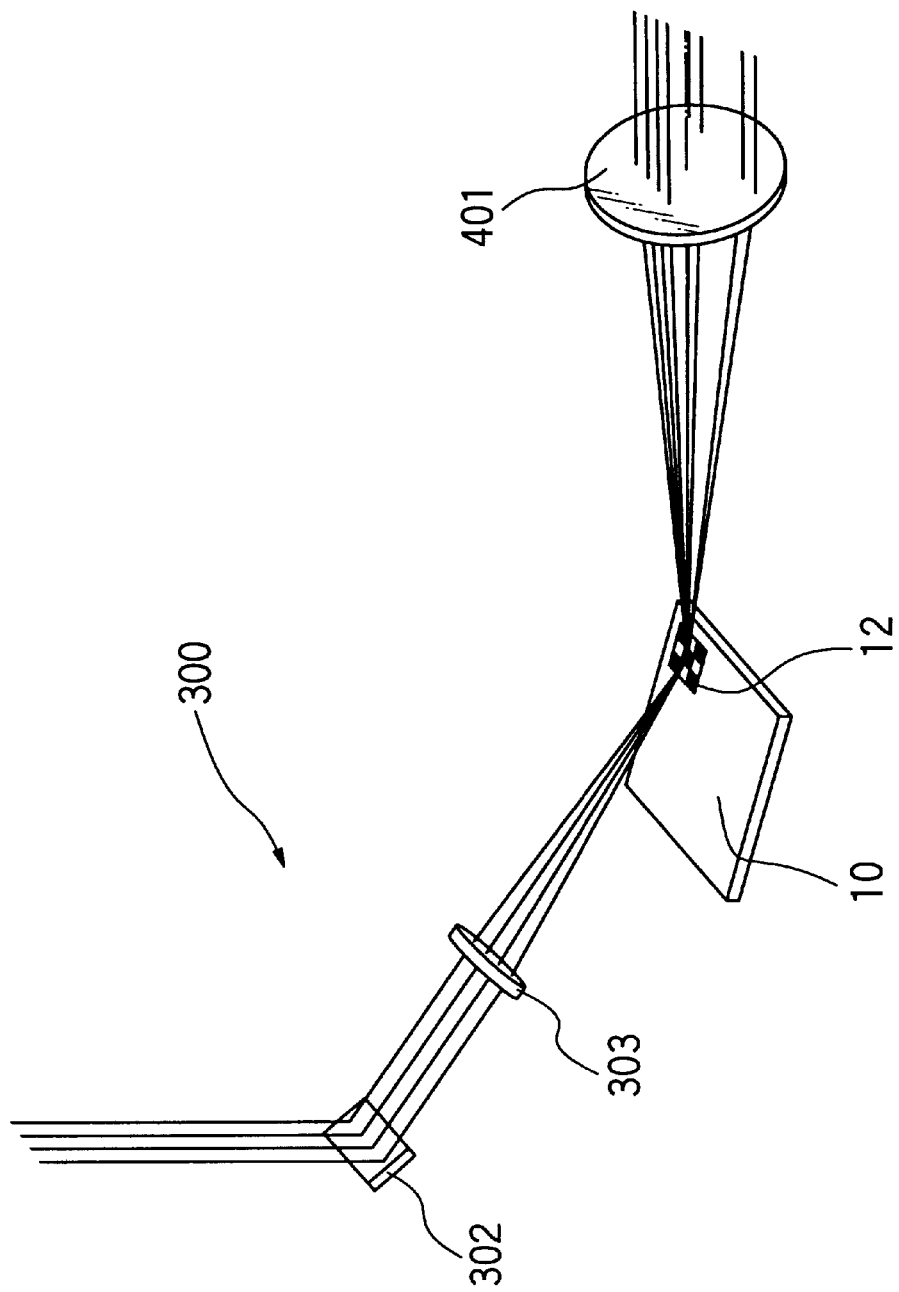
FIG. 17 is a fragmentary view, in an enlarged scale, of the object portion shown in FIG. 1.

An example of such an electron beam lithography system will be described. Referring to FIG. 15, the electron beam lithography system comprises an electronic optical system 730 including an electron gun for generating an electron beam, X and Y-direction scanning electrodes used to change the orientation of the electron beam and others, and a stage 734 on which an object to be drawn 732 disposed in a vacuum chamber on use can be mounted, the stage 734 being movable in the X and Y directions within its horizontal plane and in the Z direction that is the normal direction.

On the opposite sides of the stage 734 are respectively disposed an illumination side optical housing 740 including the illumination optical system 100, compensation optical system 200 and irradiation optical system 300 in the position measuring apparatus of the present invention and a light-reception side optical housing 742 including the light-reception optical system 400. These optical housings 740 and 742 are arranged avoiding the mounts of various components in the electron beam lithography system such as the electronic optical system 730 and so on and their maximum range of operation. Light beam is emitted from the illumination side optical housing 740 into the light-reception side optical housing 742 such that the beam can pass through the position measuring apparatus avoiding the mounts of various components in the electron beam lithography system such as the electronic optical system 730 and so on and their maximum range of operation.

The electron beam lithography system is designed to form a given pattern on a mask or wafer being an object to be drawn through an electron beam when the electronic optical system and stage are operated in a given manner in response to various signals from the control circuit.

More particularly, the electron beam lithography system to which the position measuring apparatus of the present invention is applied can work an encoder pattern, semiconductor producing masks such as phase shift mask and so on.

The semiconductor aligner to which the position measuring apparatus of the present invention is applied can work semiconductor wafers and semiconductor producing masks.

According to the present invention, the measurement of position can be carried out without dependent on change of the reflected light from the object by using the light heterodyne process and utilizing the reference signals from the measuring signals as well as the reflection diffracted lights from the object.

The present invention can steadily measure the position without creation of any drift due to the charge-up and without damage of the resist by using the laser light source.

By only using the diffracted lights included in the adjacent quadrants appearing on the object side, the present invention can save the necessary space. Thus, the position measuring apparatus of the present invention can be installed into any system having a limited space in which the position measuring apparatus is disposed, such as the electron beam aligner and stepper.

What is claimed is:

1. A position measuring apparatus comprising:

a light source unit for emitting a coherent light to provide an illuminating beam;

a frequency shifter unit for converting the beam from said light source unit into a beam having its frequency different from that of said illuminating beam and for radiating the converted beam;

an illumination optical system for converting the illuminating beam from the light source unit into a first plane position measurement illuminating beam and the beam from the frequency shifter unit into a second plane position measurement illuminating beam, said illumination beam being used to irradiate a two-dimensional pattern on an object to be measured with respect to its position;

a light-reception optical system for receiving a diffracted light from the two-dimensional pattern;

a light receiving unit for receiving a combination of a higher-order diffracted light appearing on the object side from the zero-order diffracted light in the diffracted light received by the light-reception optical system with the zero-order diffracted light different in frequency from the higher-order diffracted light and also an interference light from a combination of higher-order diffracted lights appearing on the object side from the zero-order diffracted light, said higher-order diffracted light being different in frequency from one another, said light receiving unit being adapted to form a position measuring interference measurement signal used to perform the positional measurement in the plane of the object including the two-dimensional pattern; and a signal processing unit for determining the position of the object in the plane including the two-dimensional pattern in response of the phase of the position measuring interference measurement signal.

2. The position measuring apparatus according to claim 1 wherein said light-receiving unit is adapted to form an X position measuring interference measurement signal representative of the X-direction position of the object in the plane including the two-dimensional pattern from a combination of the higher-order diffracted light from the first plane position measurement illuminating beam with the higher-order diffracted light from the second plane position measurement illuminating beam and also to form a Y position measuring interference measurement signal from a combination of the zero-order diffracted light from the first plane position measurement illuminating beam with the higher-order diffracted light from the second plane position measurement illuminating beam or a combination of the higher-order diffracted light from the first plane position measurement illuminating beam with the zero-order diffracted light from the second plane position measurement illuminating beam, and wherein the signal processing unit is adapted to determine the X-direction position of the object from the phase of the X position measuring interference measurement signal and to determine the Y-direction position of the object from the phase of the Y position measuring interference measurement signal.

3. The position measuring apparatus according to claim 2 wherein said light-receiving unit is further adapted to form an X position measuring interference reference signal from a combination of zero-order diffracted lights of the first and second plane position measurement illuminating beams due to the two-dimensional pattern, said zero-order diffracted light being different in frequency from each other, and also adapted to form a Y position measuring interference reference signal from a combination of the higher-order diffracted light of the first plane position measurement illuminating beam with the zero-order diffracted light of the second plane position measurement illuminating beam or a combination of the zero-order diffracted light of the first plane position measurement illuminating beam with the higher-order diffracted light of the second plane position measurement illuminating beam, and wherein said signal processing unit is adapted to determine the X-direction position of the object from the differential phase between the X position measuring interference measurement signal and the X position measuring interference reference signal and also adapted to determine the Y direction position of the object from the differential phase between the Y position measuring interference measurement signal and the Y position measuring interference reference signal.

4. The position measuring apparatus according to claim 3 wherein said light-receiving unit is so formed that the X position measuring interference measurement and reference signals equally contain information of mis-registration in the Y direction and that the Y position measuring interference measurement and reference signals equally contain information of mis-registration in the X-direction.

5. The position measuring apparatus according to claim 4 wherein said signal processing unit is adapted to determine the phase and phase difference from signals formed by heterodyne detecting and processing the respective interference measurement signals.

6. An electron beam lithography system including a position measuring apparatus being disposed to avoid the mounts of the components in said electron beam lithography system and their maximum range of operation;

said position measuring apparatus comprising:
  a light source unit for emitting a coherent light to provide an illuminating beam;
  a frequency shifter unit for converting the beam from said light source unit into a beam having its frequency different from that of said illuminating beam and for radiating the converted beam;
  an illumination optical system for converting the illuminating beam from the light source unit into a first plane position measurement illuminating beam and the beam from the frequency shifter unit into a second plane position measurement illuminating beam, said illumination beam being used to irradiate a two-dimensional pattern on an object to be measured with respect to its position;
  a light-reception optical system for receiving a diffracted light from the two-dimensional pattern;
  a light receiving unit for receiving a combination of a higher-order diffracted light appearing on the object side from the zero-order diffracted light in the diffracted light received by the light-reception optical system with the zero-order diffracted light different in frequency from the higher-order diffracted light and also an interference light from a combination of higher-order diffracted lights appearing on the object side from the zero-order diffracted light, said higher-order diffracted light being different in frequency from one another, said light receiving unit being adapted to form a position measuring interference measurement signal used to perform the positional measurement in the plane of the object including the two-dimensional pattern; and
  a signal processing unit for determining the position of the object in the plane including the two-dimensional pattern in response of the phase of the position measuring interference measurement signal;

said position measuring apparatus further comprising an illumination side optical member for irradiating a position measuring beam used to measure the position of an object and a light-reception side optical member for receiving a reflected and diffracted light from the object to measure the position of the object; and said optical members being so disposed that the beam entering the light-reception side optical member from the illumination side optical member can pass through the electron beam lithography system while avoiding the mounts of the components in said electron beam lithography system and their maximum range of operation.

7. The electron beam lithography system according to claim 6 wherein said light-receiving unit is adapted to form an X position measuring interference measurement signal representative of the X-direction position of the object in the plane including the two-dimensional pattern from a combination of the higher-order diffracted light from the first plane position measurement illuminating beam with the higher-order diffracted light from the second plane position measurement illuminating beam and also to form a Y position measuring interference measurement signal from a combination of the zero-order diffracted light from the first plane position measurement illuminating beam with the higher-order diffracted light from the second plane position measurement illuminating beam or a combination of the higher-order diffracted light from the first plane position measurement illuminating beam with the zero-order diffracted light from the second plane position measurement illuminating beam and wherein the signal processing unit is adapted to determine the X-direction position of the object from the phase of the X position measuring interference measurement signal and to determine the Y-direction position of the object from the phase of the Y position measuring interference measurement signal.

8. The electron beam lithography system according to claim 7 wherein said light-receiving unit is further adapted to form an X position measuring interference reference signal from a combination of zero-order diffracted lights of the first and second plane position measurement illuminating beams due to the two-dimensional pattern, said zero-order diffracted light being different in frequency from each other, and also adapted to form a Y position measuring interference reference signal from a combination of the zero-order diffracted light of the first plane position measurement illuminating beam with the higher-order diffracted light of the second plane position measurement illuminating beam or a combination of the higher-order diffracted light of the first plane position measurement illuminating beam with the zero-order diffracted light of the second plane position measurement illuminating beam, and wherein said signal processing unit is adapted to determine the X-direction position of the object from the differential phase between the X position measuring interference measurement signal and the X position measuring interference reference signal and also adapted to determine the Y direction position of the object from the differential phase between the Y position measuring interference measurement signal and the Y position measuring interference reference signal.

9. The electron beam lithography system according to claim 8 wherein said light-receiving unit is so formed that the X position measuring interference measurement and reference signals equally contain information of mis-registration in the Y direction and that the Y position measuring interference measurement and reference signals equally contain information of mis-registration in the X-direction.

10. The electron beam lithography system according to claim 9 wherein said signal processing unit is adapted to determine the phase and phase difference from signals formed by heterodyne detecting and processing the respective interference measurement signals.

* * * * *